US012754480B2

(12) United States Patent
Groisman

(10) Patent No.: US 12,754,480 B2
(45) Date of Patent: Oct. 6, 2026

(54) UV LITHOGRAPHY SYSTEM AND METHOD

(71) Applicant: THE REGENTS OF THE UNIVERSITY OF CALIFORNIA, Oakland, CA (US)

(72) Inventor: Alexander Groisman, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 540 days.

(21) Appl. No.: 18/284,833

(22) PCT Filed: Mar. 31, 2022

(86) PCT No.: PCT/US2022/022880
§ 371 (c)(1),
(2) Date: Sep. 28, 2023

(87) PCT Pub. No.: WO2022/212738
PCT Pub. Date: Oct. 6, 2022

(65) Prior Publication Data

US 2024/0393696 A1 Nov. 28, 2024

Related U.S. Application Data

(60) Provisional application No. 63/169,102, filed on Mar. 31, 2021.

(51) Int. Cl.
*G03F 7/00* (2006.01)
*G03F 7/20* (2006.01)

(52) U.S. Cl.
CPC ............ *G03F 7/201* (2013.01); *G03F 7/2004* (2013.01); *G03F 7/70725* (2013.01)

(58) Field of Classification Search
CPC .... G03F 7/201; G03F 7/2004; G03F 7/70725; G03F 7/203; G03F 7/2041; G03F 7/22; G03F 7/70008; G03F 7/7035; G03F 7/0002; G03F 7/70091
See application file for complete search history.

(56) References Cited

U.S. PATENT DOCUMENTS 4,757,208 A 7/1988 McKenna et al.
2009/0147226 A1 6/2009 Horiuchi et al.
2012/0212718 A1 8/2012 Boef
2012/0314194 A1 12/2012 Onvlee et al.
(Continued)

OTHER PUBLICATIONS

Challa, P., et al., Microfluidic devices fabricated using fast wafer-scale LED-lithography patterning, Biomicrofluidics 11, 014113, 2017, pp. 1-8.
(Continued)

*Primary Examiner* — Hung V Nguyen
(74) *Attorney, Agent, or Firm* — Eleanor Musick; Torrey Pines Law Group PC

(57) ABSTRACT

A photolithography system includes an optical assembly for delivering a collimated light beam with spatially uniform light across the beam to a substrate on a substrate mount. A multi-axis support assembly provides for angular and rotational control of relative positioning of the optical assembly and the substrate mount to allow fabrication of microfeatures with different draft angles.

30 Claims, 21 Drawing Sheets

(56) References Cited

U.S. PATENT DOCUMENTS

| | | | | |
|---|---|---|---|---|
| 2016/0062246 | A1* | 3/2016 | Clube | G03F 7/70408 355/67 |
| 2019/0004435 | A1* | 1/2019 | De Jager | G03F 7/70383 |
| 2019/0137481 | A1 | 5/2019 | Tkachenko et al. | |

OTHER PUBLICATIONS

Han, M., et al., Fabrication of 3D Microstructures with Single UV Lithography Step, Journal of Semiconductor Technology and Science, Dec. 2002, pp. 268-272, vol. 2, No. 4.
Karmakar, R., et al., Novel micropatterning technique reveals dependence of cell-substrate adhesion and migration of social amoebas on parental strain, development, and fluorescent markers, PLOS One, doi.org/10.1371/journal.pone.0236171, Jul. 23, 2020, pp. 1-20.
Shiba, S., et al., Multidirectional UV-LED lithography using an array of high-intensity UV-LEDs and tilt-rotational sample holder for 3-D microfabrication, Micro and Nano Systems Letters, 2020, 8:5, doi.org/10.1186/s40486-020-00107-y, pp. 1-12.
Strale, P., et al., Multiprotein Printing by Light-Induced Molecular Adsorption, Advanced Materials, 2015, DOI: 10.1002/adma.201504154, pp. 1-6.
PCT/US2022/022880 International Search Report and Written Opinion, Jun. 16, 2022, 9 pages.

* cited by examiner

Microstructures of strips (ridges) on a silicon wafer substrate. Lithography with 15° tilt.

Microstructures of strips (ridges) on a silicon wafer substrate. Lithography with 30° tilt.

Microstructures with shapes of conical and modified square frustums on a silicon wafer substrate Microstructures with shapes of conical and modified square frustums on a silicon wafer substrate Arrays of conical frustums under bright-field illumination Arrays of conical frustums under dark-field illumination Arrays of conical frustums under dark-field illumination

UV LITHOGRAPHY SYSTEM AND METHOD

RELATED APPLICATIONS

This application is a 371 national stage filing of International Application No. PCT/US2022/022880, filed Mar. 31, 2022, which claims the benefit of the priority of U.S. Application No. 63/169,102, filed Mar. 31, 2021, each of which is incorporated herein by reference in its entirety.

FIELD OF THE INVENTION

The present invention relates to a system, method, and applications of photolithographic fabrication and patterning of microstructures on a substrate as well as of using the substrates with the microstructures as masters for molding and embossing.

BACKGROUND

Photolithography has been widely used in industry and research for decades as the fabrication process is relatively simple with high repeatability. Photolithography techniques that rely on transferring small-scale structures from photomasks onto flat substrates, typically silicon or glass wafers, represent one of the primary fabrication processes in microelectronics, and micro-devices, including microfluidics. Microfluidics is the science of manipulating and controlling fluids and particles at micron and submicron dimensions. The substrates with microstructures made with UV-photolithography are commonly used as masters for micro-molding and micro-embossing to make arrays of microwells and networks of micro-channels for microfluidic devices. Microfluidic devices and arrays of microwells have many chemical, biochemical, biological, and biotechnological applications.

The ultra-violet (UV) radiation used to activate UV sensitive photoresists has historically been obtained using gas-discharge lamps, e.g., mercury vapor, to provide the power and uniformity necessary for exposure of the photoresist (PR). More recently, however, efforts have been directed to the fabrication of microstructures using UV radiation from LEDs. LEDs possess many advantages over gas-discharge lamps, including lower cost, lower energy consumption, more rapid activation, and longer life spans. There are several requirements for an effective and accurate UV source for use in lithography: (1) the light must be uniform over a large enough area to maintain compatibility with standard wafer substrates and to ensure uniform energy dosing, and (2) the emission spectrum must have a narrow bandwidth to match the required wavelength for optimal PR exposure. The illumination must also be well collimated to ensure sharply defined features in the fabricated microstructures.

The early UV LEDs had substantially lower luminous powers than the mercury arc lamps used in the standard UV-photolithography machines. Therefore, in some UV LED-based photolithography setups, the light was derived from arrays of individual UV LEDs. Erickstad et al. ("A low-cost low-maintenance ultraviolet lithography light source based on light-emitting diodes", *LOC* 15, 57-61, 2015; DOI: 10.1039/c4lc00472h) described a 3×3 array of 365 nm LEDs, each with an individual collimator comprising two coaxial lenses to produce a UV-light beam ~90×90 mm in cross-section. A similar setup using a 5×5 array of UV LEDs with individual collimators was described by Shiba et al. ("Multidirectional UV-LED lithography using an array of high-intensity UV-LEDs and tilt-rotational sample holder for 3-D microfabrication", *Micro and Nano Syst. Lett.,* 8:5 2020) in a setup with a tilted and rotating substrate mount and to produce tilted structures in negative photoresist.

The multi-LED array approach has substantial drawbacks, including the fact that overlapping light from multiple sources makes it difficult to ensure uniform light intensity over the entire cross-section of the beam. In addition, this arrangement inevitably results in a substantial divergence and spatial non-uniformity of the direction of the beam, thus reducing the degree of collimation. First, the requirement for the beams from the different individual LEDs to overlap necessitates deliberate divergence of the individual beams, resulting in different average angles of incidence of the UV-light upon the photomask (and the photoresist). Second, the beams from individual LEDs each have an angle of divergence proportional to the ratio between the diameter of the luminous region of the LED and the effective distance between the luminous region and the collimating lens.

A UV-photolithography setup with a light source with a single UV LED and a single collimating lens has been described by Challa, P. K., et al. ("Microfluidic devices fabricated using fast wafer-scale LED-lithography patterning", *Biomicrofluidics,* 11, article #014113, 2017). In this paper, the diameter of a collimating lens was only 60 mm, making it suboptimal for UV-photolithography on substrates that are greater than 5 cm (2 inches) in diameter.

The collimation of the light beam in UV-photolithography machines is rarely perfect, as manifested by non-uniformity of the characteristic direction of the beam over its cross-section and by divergence of the beam. The spatial non-uniformity of the characteristic direction may be caused by imperfections in the collimating optics and/or by the light source(s) not being in the exact focal point of the collimator. This spatial non-uniformity leads to different average angles of incidence of the beam upon the photomask (tilt angles) in different areas of the photomask. For UV-photolithography, these non-zero and non-uniform tilt angles can result in tilted microstructures (with parallelogram profiles) with different angles and directions of the tilt in different areas of the substrate. The problems of beam divergence are exacerbated when the photoresist is thick and/or when there is a substantial distance between the photomask and photoresist. Furthermore, even when a well-collimated beam passes through the small transparent region on the photomask, it is bound to diverge and may generate tapered microstructures with trapezoidal profiles expanding towards the substrate. While tapered structures may ultimately be the goal, control of the draft angles is essential for accuracy and repeatable performance of the microstructures.

The use of UV-photolithography to fabricate microstructures with tapered profiles and conical and modified polygonal frustums has been reported using mercury arc lamps. The optical assemblies were relatively bulky and heavy, so adjustment of the tilt angle was achieved by rotating and tilting the substrate support while keeping the optical assemblies motionless. One drawback to this approach is that the rotation of the substrate can potentially impact photoresist thickness uniformity. Another drawback is that a rotating substrate support can be difficult to combine with a mask aligner, which is necessary when multiple patterns are to be formed on the substrate using multiple masks. For example, micro-channels with a range of different channel depths adds function and versatility to microfluidic devices. The formation of different channel depths requires multiple masking steps, making compatibility with a mask aligner is important.

The degree of curing of the UV-curable materials depends on the cumulative dose of the UV-light. Microstructures with similar draft angles in all directions can be generated by selecting a certain tilt angle and directing the UV-light beam at the photomask from all sides, while maintaining the beam for a sufficient exposure time. An even exposure from all sides can be practically achieved by a continuous rotation of the optical assembly producing the beam around the direction orthogonal to the plane of the photomask by 360° or some multiple thereof.

UV-curable materials, e.g., negative photoresists, are particularly appealing for making UV-photolithography fabricated masters for molding, because the heights of the microstructures can be selected in a broad range (from <1 μm to >200 μm for SU8 resist). While patterned microstructures are generally fairly robust, an even more durable master with the same microstructure can be made from a monolithic material, such as an epoxy or metal, by creating a mold of the lithographically-fabricated master in a soft flexible material (such as a silicone elastomer, e.g., polydimethylsiloxane, PDMS) and using the mold to form a replica in the monolithic material.

The elements of the regular (macroscopic) masters made for molding and hot embossing of hard thermoplastics often have tapered (trapezoidal) cross-sections, widening towards the base of the mold to facilitate separation of the molded part from the mold. The ability to produce microstructures having tapered profiles with controlled draft angles, i.e., negative, positive and no angle, has a substantial practical utility.

Molecular printing and micro-patterning involve the controlled deposition of molecules on a substrate at the micrometer scale. Micropatterned substrates are now widely used in biological research for tissue cultures of adherent cells, with the micro-patterns defining the areas where the cell adhesion is facilitated or inhibited. Typical molecular printing and micro-patterning methods either rely on a slow serial writing process or are based on a parallelized UV-photolithographic process. In this process, the exposure to UV-light results in either selective retention or elimination of the molecular coating in the areas exposed to the UV-light.

FIG. 1 illustrates an exemplary prior art process for micro-patterning a molecular coating is shown. The process is described in the 2016 paper by P-O. Strale, et al., (*Adv. Mater,* 2015 (doi/abs/10.1002/adma.201504154)). The substrate was initially coated with a surface-blocking material (antifouling Polyethylene glycol (PEG) layer), as shown in FIG. 1, Panel 1. The medium containing a UV-light-sensitive photo-initiator was then added as shown in FIG. 1, Panel 2. A first pattern on the substrate was created under a UV exposure, where a chemical reaction occurred. Next, the adhesion-blocking PEG molecules were removed from the UV-illuminated areas, following incubation and processing, as shown in FIG. 1, Panels 3 and 4. The substrate was then incubated under a solution of surface-adhering proteins, which adhered to the areas without the adhesion-blocking coating, but not to the areas with the coating. Thus, when adherent cells were plated onto the substrate, they selectively adhered to the UV-illuminated areas, but not to the rest of the substrate, as shown in FIG. 1, Panels 5 and 6. This technology was commercialized in the PRIMO™ system, available from Alveole (Paris, FR). This system, however, is relatively expensive, requires a microscope, and uses a microscopic projection/direct writing technique, which results in a low throughput and only works for small areas.

As is generally known in the field of photolithography, when a mask is in contact with photoresist and a highly collimated light source is used, divergence of the beam is relatively small. As the separation between the mask and the UV-light-sensitive material (photoresist or molecular coating) increases so does divergence and loss of resolution. Nonetheless, in some cases, placing the photomask at a relatively large distance from UV-sensitive material is particularly advantageous for the generation of micro-patterns on a surface of a transparent substrate that is inaccessible and/or cannot be readily placed in a close contact with a mask.

One example of the need for increased mask-substrate separation arises when a substrate coated with a thin layer of a UV-light-sensitive material or molecular coating is submerged in a liquid medium. The submersion in a liquid medium may be essential because the surface needs to remain wet or because the medium carries reagents facilitating the UV-induced micro-patterning. Another example is a UV-light-sensitive material deposited on a layer of a soft, sticky, or otherwise mechanically delicate material, such as hydrogel or silicone gel, on the surface of a transparent substrate. In both cases, the substrate can be a thin glass, such a microscope cover glass with a thickness of ~0.15, ~0.17, or ~0.22 mm for the standard #1, #1.5, and #2 cover glasses, respectively. Microscope cover glass substrates are particularly appealing because of their use as substrates for live cells and because of their compatibility with imaging using high-resolution microscope objective lenses. When the divergence of the UV-light beam is relatively small, placing the photomask on the accessible side of a thin transparent substrate results in relatively small differences between the diameters of the regions of the UV-light-sensitive material on the inaccessible side that are exposed to the UV-light and the adjacent transparent regions on the photomask through which the exposure occurs.

In view of the foregoing challenges, there remains a need for a system and methods for producing microstructures on a substrate with controlled draft angles and microstructures with controlled geometric shapes, which also can be used in molding and embossing.

SUMMARY

According to the embodiments described herein, the inventive UV-photolithography system and methods overcome disadvantages in the art through a combination of features. The system has a substrate mount configured to receive a substrate and an optical assembly with an LED UV-light source and a light collimator for delivering a collimated light beam having spatially uniform light intensity across the light beam to an illumination area proximate to the substrate mount. The LED UV-light source has a luminous area and produces a diverging light beam, which is in optical connection with the collimator. The collimator receives light from the luminous area of the light source and generates a collimated light beam with a spatially uniform light intensity across the light beam. According to one embodiment, the light source is characterized in that more than one-third of the power of the UV-light in the collimated light beam emanates from the luminous area of the light source, and wherein the luminous area of the light source has a diameter of less than one-third of the diameter of the collimated light beam. The UV-photolithography system has a support assembly for movably positioning the optical assembly relative to the substrate mount, such that the collimated light beam is directable at the illumination area at variable and controllable directions and angles. The support assembly components comprise a rotating support having an axis of rotation, and an adjustable angle mount for directing the collimated light beam at the variable and controllable directions and angles upon the illumination area. In some embodiments, the UV-photolithography system also has a solid substrate with a surface, preferably a surface that has been treated for low (minimal or no) reflection of UV-light. The substrate can be a polished silicon wafer or glass wafer, and the reflection of UV-light from its surface can be reduced by coating the surface with an antireflection (AR) material as are known in the art. A light-sensitive material is positioned on the surface of the substrate. In some embodiments, the light-sensitive material comprises a UV-curable material, which can be a UV-curable epoxy or a UV-curable photoresist (negative photoresist). The UV-curable (negative) photoresist can be a liquid photoresist from the SU8 family, or a dry film photoresist (e.g., SUEX® and ADEX™ from DJ MicroLaminates, Inc., Sudbury, MA, USA). A photomask is provided which has a patterned area with a pattern of opaque and transparent regions. The photomask is positionable, i.e., movable to a fixed position with respect to the substrate, and on the path of the collimated light beam towards the light-sensitive material. In some embodiments, the photomask is attached to a mask holder, and the mask holder and the substrate mount are both attached or affixed to a mask aligner, making it possible to position and orient the photomask and substrate with respect to each other. In some embodiments, the photomask has a pattern of transparent circles or transparent polygons with opaque regions in between, and the photomask is used to produce an array of microstructures with the shapes of conical or modified polygonal frustums on the substrate.

The system described herein is capable of generating solid microstructures with well-defined draft angles on a substrate, where the draft angles are uniform over the entire area under the photomask, and are also identical for different orientations of the microstructures. The system described herein is capable of generating microstructures in a process of highly parallelized contact photolithography, with large substrate areas (e.g., areas matching the surface of a standard multi-well plate). The system described herein is also capable of generating substrates with micro-patterned molecular coatings within relatively short time intervals, potentially opening the way to affordable large-scale micro-patterned substrates for cell culture applications.

In one aspect of the invention, a system for photolithographic fabrication of includes: a substrate mount configured to support a substrate; an optical assembly comprising: an LED light source having a luminous area configured to emit ultraviolet (UV) light along an optical path, the luminous area having an area diameter; and a light collimator disposed within the optical path and configured to receive light from the LED light source and generate a collimated light beam having a beam diameter with a spatially uniform light intensity of UV-light across the collimated light beam, wherein more than one-third of a power of the UV-light in the collimated light beam emanates from the luminous area, and wherein the area diameter is less than one-third of the beam diameter, wherein the optical assembly is configured to deliver a collimated light beam along the optical path to an illumination area proximate to the substrate mount; a photomask aligner disposed on the substrate mount, the photomask aligner configured to retain a patterned photomask within the optical path for projection of a pattern onto the substrate, the pattern corresponding to at least a portion of the microstructures; and a multi-axis support assembly comprising a rotating support having an axis of rotation and an adjustable angle mount, the support assembly configured for varying one or more of a direction and an angle of the collimated beam relative to the substrate on the substrate mount. In one embodiment, the optical assembly may be disposed at a fixed position relative to a base and the substrate mount is disposed on the adjustable angle mount configured to tilt the substrate mount relative to the base so that the collimated light impinges on the photomask and the substrate at a predetermined angle. In another embodiment, the optical assembly may be disposed at a fixed position relative to a base and the substrate mount is disposed on the rotating support affixed to the base and configured to rotate the substrate mount relative to the optical assembly. In still another embodiment, the substrate mount may be disposed on a base and the optical assembly is disposed on the adjustable angle mount configured to move relative to the base so that the collimated light impinges on the photomask and the substrate at a predetermined angle. In yet another embodiment, the substrate mount may be disposed on the rotating support affixed to the base and the optical assembly is disposed on the adjustable angle mount configured to tilt relative to the base so that the collimated light impinges on the photomask and the substrate at a predetermined angle. The light collimator may include a proximal lens having a first diameter and a distal lens having a second diameter, wherein the proximal lens is disposed at first distance from the light source and the distal lens is disposed at a second distance from the light source so that the collimated light beam diverges by less than 0.01 radian (full width at half height) over a cross-section of an approximately 12.5 cm diameter circle. The effective ratio of the area diameter and the second distance is on the order of 0.008. The second diameter may be within a range of 70 mm to 200 mm, while the first diameter is approximately 75 mm. The proximal lens and the distal lens may each be selected from a plano-convex lens, a meniscus lens, a double convex lens, and a Fresnel lens and may be coated with an anti-reflection coating.

The photomask aligner is configured to translate the photomask in at least an X-Y plane relative to the substrate mount. The beam diameter is preferably within a range of 60 mm to 125 mm, where the spatially uniform light intensity varies by less than 10% peak-to-peak and the collimated light beam diverges by less than 0.03 rad (full width at half-height).

In another aspect of the invention, a method for fabrication of microstructures on a substrate includes applying a UV-light-sensitive coating to a surface of the substrate and, using the system described above, disposing the coated substrate on the substrate mount; aligning the photomask with the substrate; controlling the support assembly to modify an incident angle of the collimated light beam impinging on the patterned photomask; exposing the coated substrate to portions of the collimated light beam transmitted through the patterned photomask for one or more exposures to define the microstructures within the UV-light-sensitive coating; and removing unexposed UV-light-sensitive coating from the substrate to leave defined microstructures on the substrate. In some embodiments, the steps of controlling the support assembly and exposing the coated substrate involve adjusting a tilt angle of the substrate mount relative to the optical assembly to cause the collimated light beam to impinge on the coated substrate at a non-orthogonal angle corresponding to a draft angle within one or more target microstructure; exposing the coated substrate for a first exposure; rotating the substrate mount by a first rotational increment; exposing the coated substrate for a second exposure; rotating the substrate mount by a second rotational increment; and repeating the steps of exposing an rotating for a plurality of subsequent increments until the one or more target microstructure has been fully exposed.

In other embodiments, the steps of controlling the support assembly and exposing the coated substrate involve adjusting a tilt angle of the substrate mount relative to the optical assembly to cause the collimated light beam to impinge on the coated substrate at a non-orthogonal angle corresponding to a draft angle within one or more target microstructure; exposing the coated substrate for a first exposure; rotating the optical assembly by a first rotational increment; exposing the coated substrate for a second exposure; rotating the optical assembly by a second rotational increment; and repeating the steps of exposing an rotating for a plurality of subsequent increments until the one or more target microstructure has been fully exposed.

In still another embodiment, the steps of controlling the support assembly and exposing the coated substrate include adjusting a tilt angle of the optical assembly relative to the substrate mount to cause the collimated light beam to impinge on the coated substrate at a non-orthogonal angle corresponding to a draft angle within one or more target microstructure; exposing the coated substrate for a first exposure; rotating the substrate mount by a first rotational increment; exposing the coated substrate for a second exposure; rotating the substrate mount by a second rotational increment; and repeating the steps of exposing and rotating for a plurality of subsequent increments until the one or more target microstructure has been fully exposed. In another embodiment, the steps of controlling the support assembly and exposing the coated substrate include adjusting a tilt angle of the optical assembly relative to the substrate mount to cause the collimated light beam to impinge on the coated substrate at a non-orthogonal angle corresponding to a draft angle within one or more target microstructure; exposing the coated substrate for a first exposure; rotating the optical assembly by a first rotational increment; exposing the coated substrate for a second exposure; rotating the optical assembly by a second rotational increment; and repeating the steps of exposing and rotating for a plurality of subsequent increments until the one or more target microstructures has been fully exposed.

Rotating may be performed at a continuous angular velocity configured to expose the UV-light-sensitive coating for a sufficient period of time for curing. The draft angle may be a positive angle, orthogonal, or a negative angle relative to the substrate. The one or more target microstructure may be one or more of polygonal frustums and conical frustums.

In some embodiments, the microstructures may be multiple structures having different depths and draft angles, and wherein the steps of controlling the support assembly, exposing the coated substrate, and removing unexposed are repeated using one or more additional photomask. An additional UV-light-sensitive coating may be applied to the surface of the substrate prior to repeating the steps of controlling and exposing. The incident angle of the collimated light may be changed from an initial incident angle prior to repeating the steps of controlling and exposing.

The substrate may be further coated with an anti-reflection coating. A space between the photomask and a surface of the UV-light-sensitive coating may be filled with a liquid medium configured to reduce divergence of the collimated light beam. In some embodiments, the substrate is a wafer or a cover glass. The UV-light-sensitive coating may be a UV-curable epoxy, a UV-curable photoresist, or a negative photoresist.

The method may further involve postprocessing the substrate with the defined microstructures to form a master mold, wherein a moldable material is applied to the master mold and cured to define molded microstructures comprising microwells or micro-channels. The moldable material may be a silicone elastomer. The molded microstructures formed in the molded material may be used as a secondary mold for fabricating replica microstructures in a monolithic material.

The system and method described herein are suitable for generation of microstructures with draft angles in the range from 0 to >18° on flat substrates using contact UV-photolithography and UV-curable materials, such as negative photoresists. The microstructures can be generated on a large area, e.g., an area matching the footprint of a standard multi-well plate (~108×72 mm). Because of the high collimation and small divergence of the collimated UV-light beam, the system and optical assembly can also be advantageous for UV-photolithography processes without draft angles. Specifically, the system and the optical assembly can be used for a forgiving UV-photolithography without draft angles or UV micro-patterning processes when an extended distance between the photomask and the layer of the light-sensitive material is required or desirable or when the layer of the light-sensitive material has a large thickness.

An additional application of the optical assembly with a high collimation of the UV-light beam is for contact UV-photolithography and photo-patterning through transparent substrates, when the light-sensitive material (or molecular coating) is disposed onto one side of the substrate and the photomask is placed in contact with (or proximity of) the other side of the substrate. Because of the high collimation of the beam, when the substrate is sufficiently thin, the passage of light through the substrate only results in a relatively small deterioration of the pattern of light vs the pattern of transparent and opaque regions on the photomask.

In one example, with the divergence of the 365 nm UV-light beam of 0.01 rad (full width at half height) in air, when this beam passes through a 20 μm wide transparent strip on a photomask and then through a 0.15 mm thick #1 cover glass (with a refractive index of 1.5), this beam will illuminate an approximately 22 μm wide strip on the other side of the cover glass. The widening of the illuminated strip vs. the strip on the photomask is by only 2 μm and is more due to the physical diffraction of the beam than its geometric divergence. In particular, it can be applied in the situations when the photo-patterning involves some wet chemistry, such as for generation of micro-patterns for adherent cells on thin glass or plastic substrates and for generation of solid structures from liquid precursors (such as UV-curable hydrogel or silicone pre-polymers), to which a photomask cannot be applied directly.

A key improvement provided by the embodiments described herein arises from the integration of optical and mechanical components comprising the use of an optical assembly producing a collimated UV-light beam, which is rotatably connected with respect to the substrate mount with the substrate and photomask. The UV-light source, as described herein, has a collimator, comprising a large diameter distal lens in some embodiments, which produces a highly collimated and spatially uniform beam over a large area. This light source is fully compatible with a mask aligner, eliminating the risk of shifting between the photomask and the photoresist during the UV-light exposure. The mask aligner is configured for precise movement within at least an X-Y plane, and may preferably enable movement of the mask along X, Y, and Z axes as well as rotation. The high collimation of the beam, with the divergence of only 0.01 radian (full width at half height; excluding the diffraction effects) and the non-uniformity of the characteristic direction of the beam of only ±0.005 radian over a circle with a diameter of 5 inches (12.5 cm), makes it possible to generate microstructures on the substrate with uniform profiles and draft angles over the entire area of the substrate and to tightly control the magnitude of the draft angle. The high spatial uniformity of illumination, with ~6% peak-to-peak variation of the UV-light intensity inside an approximately 5 inch (12.5 cm) diameter circle, and ~8% peak-to-peak variation inside an approximate 5.5 inch (14 cm) diameter circle, further contributes to a high spatial uniformity of the features of the microstructures over the entire area of the substrate. Importantly, the approximately 5.5 inch (14 cm) diameter circle area of collimated and spatially uniform illumination matches the footprint of standard multi-wells plates (~108×72 mm), which are widely used in the biotech industry and biological laboratory.

According to another embodiment, the system combines an optical assembly, with a 365 nm LED with a small luminous area and two coaxial plano-convex glass lenses with antireflection coatings, producing a highly collimated UV-light beam, a rotating support for the optical assembly that makes it possible to adjust the angle of incidence (tilt angle) of the collimated beam upon the horizontal photomask between 0 and 30° and continuously change the direction of incidence of the beam by rotating the optical assembly by 360°, while keeping the beam centered on the photomask, as well as mask aligner with at least X-Y motion, and preferably motion along three axes (X, Y, Z), a rotating stage, and a mask holder.

According to another embodiment, the system and method described herein is a combination of various techniques and procedures intended to optimize the quality of the UV-photolithography, including, but not limited to the treatment of the silicon wafer substrate to reduce the reflection of light, the choice of the type of the UV-curable photoresist to provide the maximal uniformity of the layer thickness, and the application of the photomask to photoresist with a liquid between the photomask and photoresist to reduce the divergence of light between the photomask and the UV-curable photoresist.

According to another embodiment, the system and method described herein are applied to UV-photolithography fabrication of microstructures with desired draft angles on the surfaces of substrates. These substrates with microstructures or their copies made in a monolith material are then used as masters for molding or embossing.

According to another embodiment, the system and method described herein are applied to photo-lithographically making microstructures forming arrays of conical or modified polygonal frustums on the surfaces of substrates. These substrates with the microstructures or their copies made in a monolith material are then used as masters for molding or embossing. The molded or embossed parts have arrays of conical or modified polygonal frustum microwells on their surfaces and can be used for chemical, biochemical, or biological applications or medical tests.

BRIEF DESCRIPTION OF DRAWINGS

The features, aspects and advantages of the present invention will become better understood from the following description, appended claims, and accompanying figures, which are incorporated in and constitute part of this specification, illustrate several embodiments of the disclosure and serve to explain the principles of this disclosure, where:

DETAILED DESCRIPTION OF EMBODIMENTS

Figure 1:
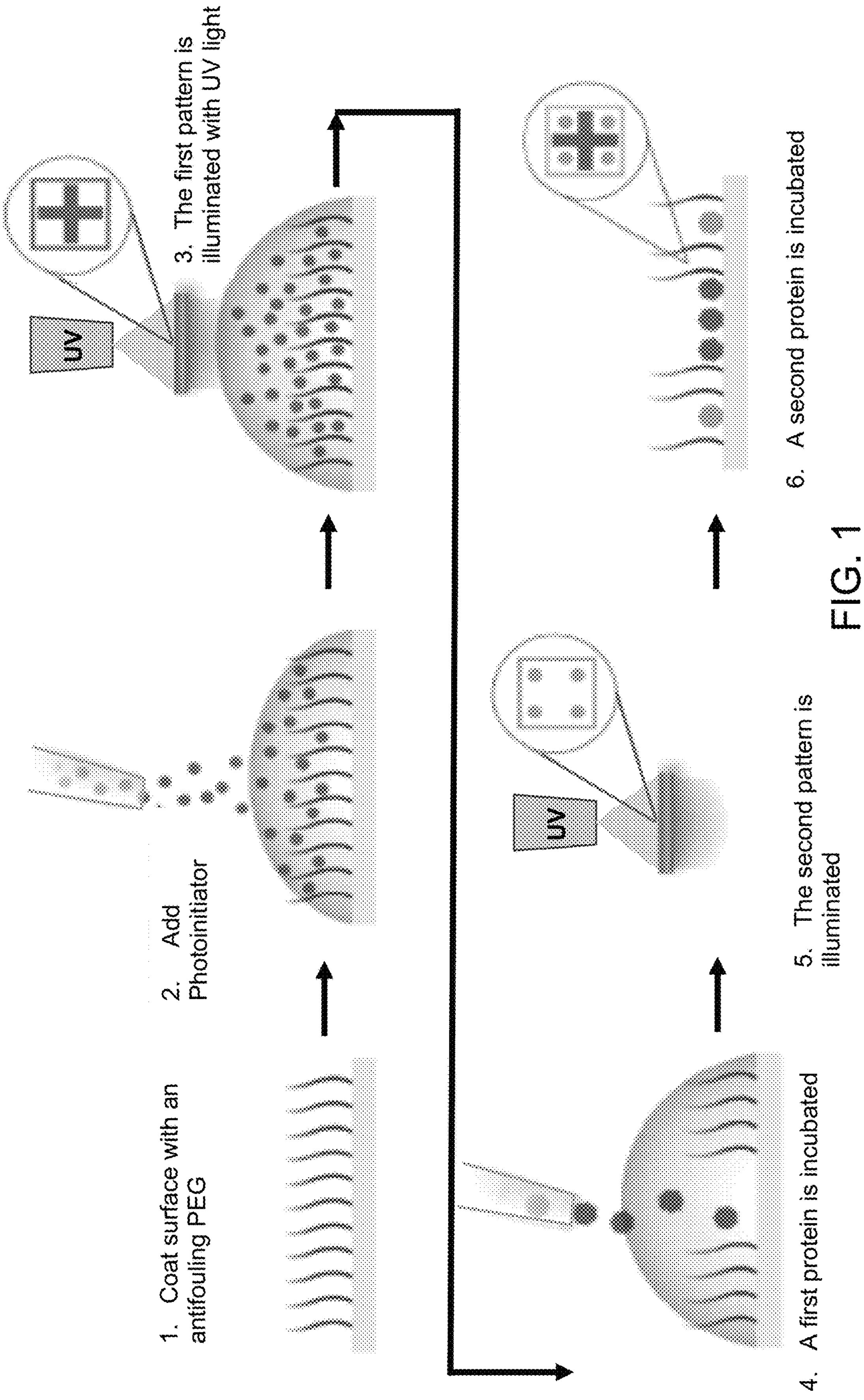
FIG. 1 PRIOR ART
FIG. 1 is a diagram illustrating a prior art sequence for micropatterning using projection with a microscope.

The inventive photolithographic system and method allow fabrication of microstructures having controlled draft angles on a substrate and for using the substrates with the microstructures as masters for molding and embossing is provided. Referring to FIGS. 2-5, and FIGS. 7-11, a UV-photolithography apparatus 100 and system according to one embodiment is shown. The apparatus 100 comprises a substrate mount 102 configured to support a substrate 104. An optical assembly 108 includes a light source 112 with a luminous area 120 and a light collimator 114. The optical assembly 108 directs light along an optical path to substrate mount 102 for delivering a collimated light beam 116 to an illumination area 106 proximate to the substrate mount 102.

The light source 112 comprises one or more LEDs emitting UV-light and has a luminous area 120, which produces a diverging light source beam 118. The light collimator 114, which may comprise one or more coaxial lenses, lies in within the optical path of light beams 118 emanating from the luminous area 120 of the light source 112 and is configured to generate the collimated light beam 116 with a spatially uniform light intensity across the beam.

As used in the art, the term "LED" can be somewhat ambiguous, because many high-power LED light sources comprise compact arrays of (visually contiguous) small LED elements, which are usually separated by small gaps. "LED" may also mean a single LED element. As used herein, reference to the size (diameter or luminous area) of an LED light source, whether a single element or an array, means the diameter (or area) of the entire luminous area (or region) of the light source, which includes the size of the entire array of small LED elements.

In some embodiments, more than one-third of the power of UV-light in the collimated light beam 116 emanates from the luminous area 120 of the light source 112, and the luminous area 120 of the light source 112 has a diameter of less than one-third of the diameter of the collimated light beam 116. In other embodiments, the luminous area 120 is within a single assembled LED device. UV-light is usually defined as the electromagnetic waves with wavelengths between 10 and 400 nm. For the purposes of this disclosure, we use a narrower definition of UV-light, defining it as the electromagnetic waves with wavelengths between 300 and 400 nm.

Figure 2:
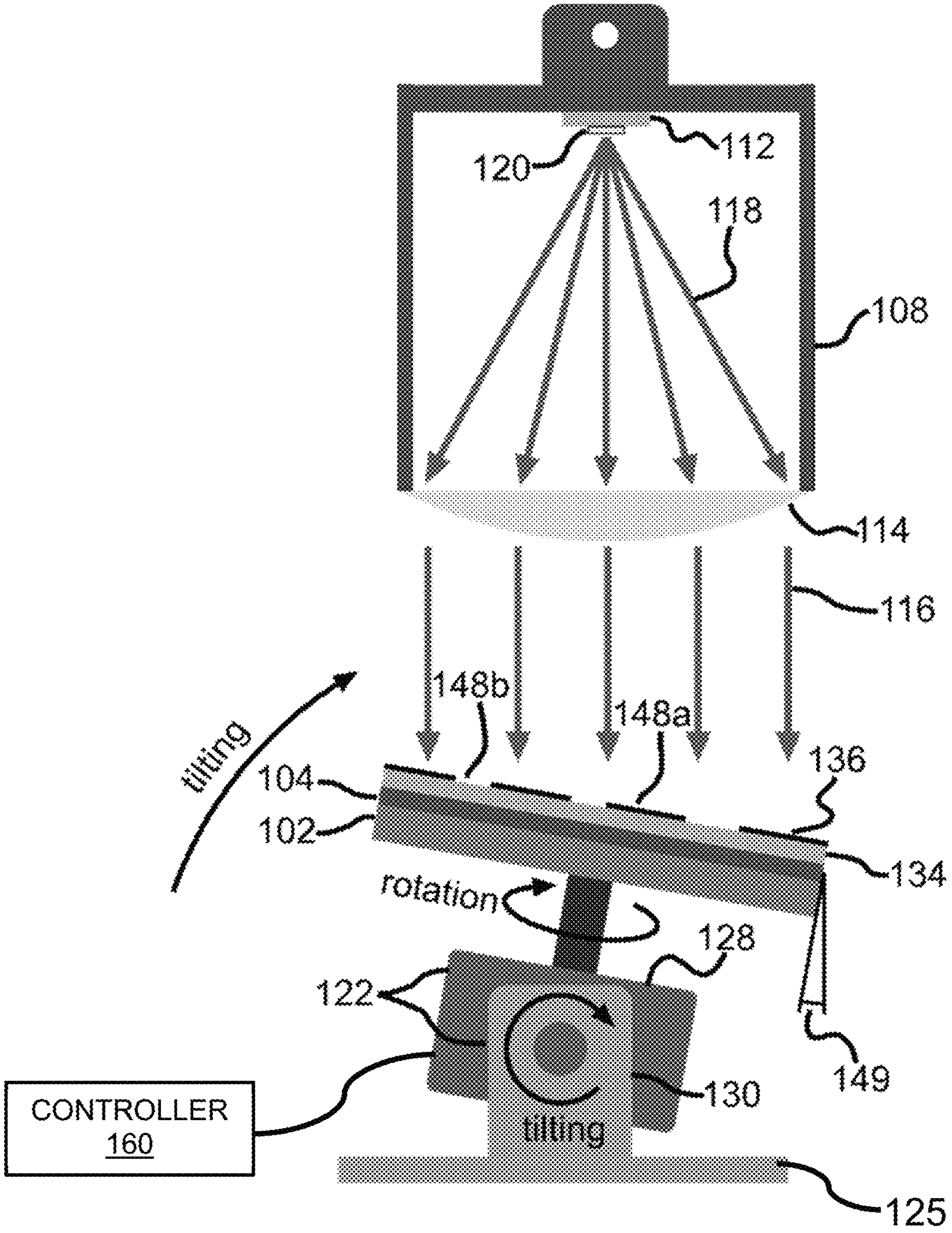
FIG. 2 is an illustration a photolithography system according to one embodiment of the inventive system.
Figure 3:
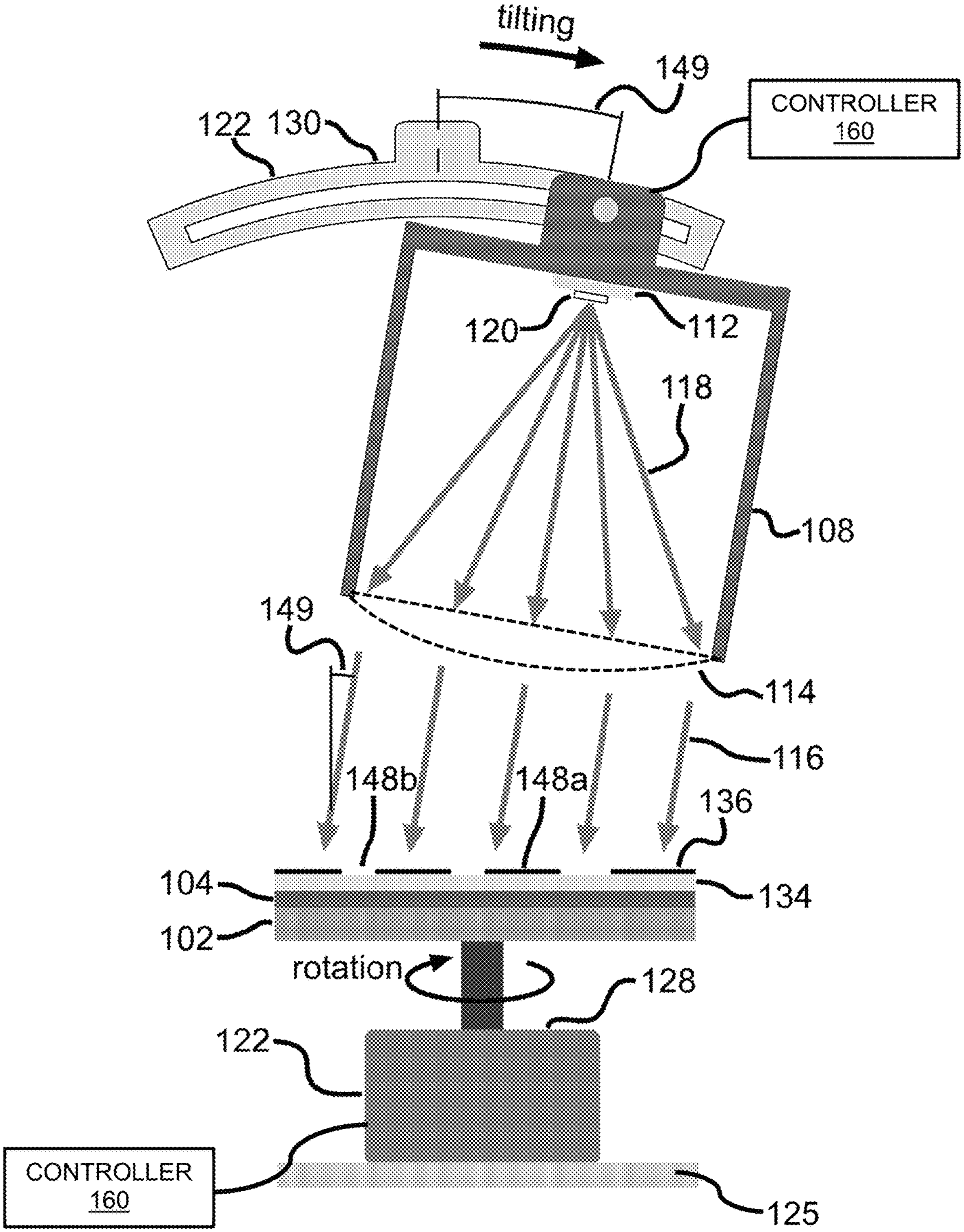
FIG. 3 is an illustration a photolithography system according to another embodiment of the inventive system.
Figure 4:
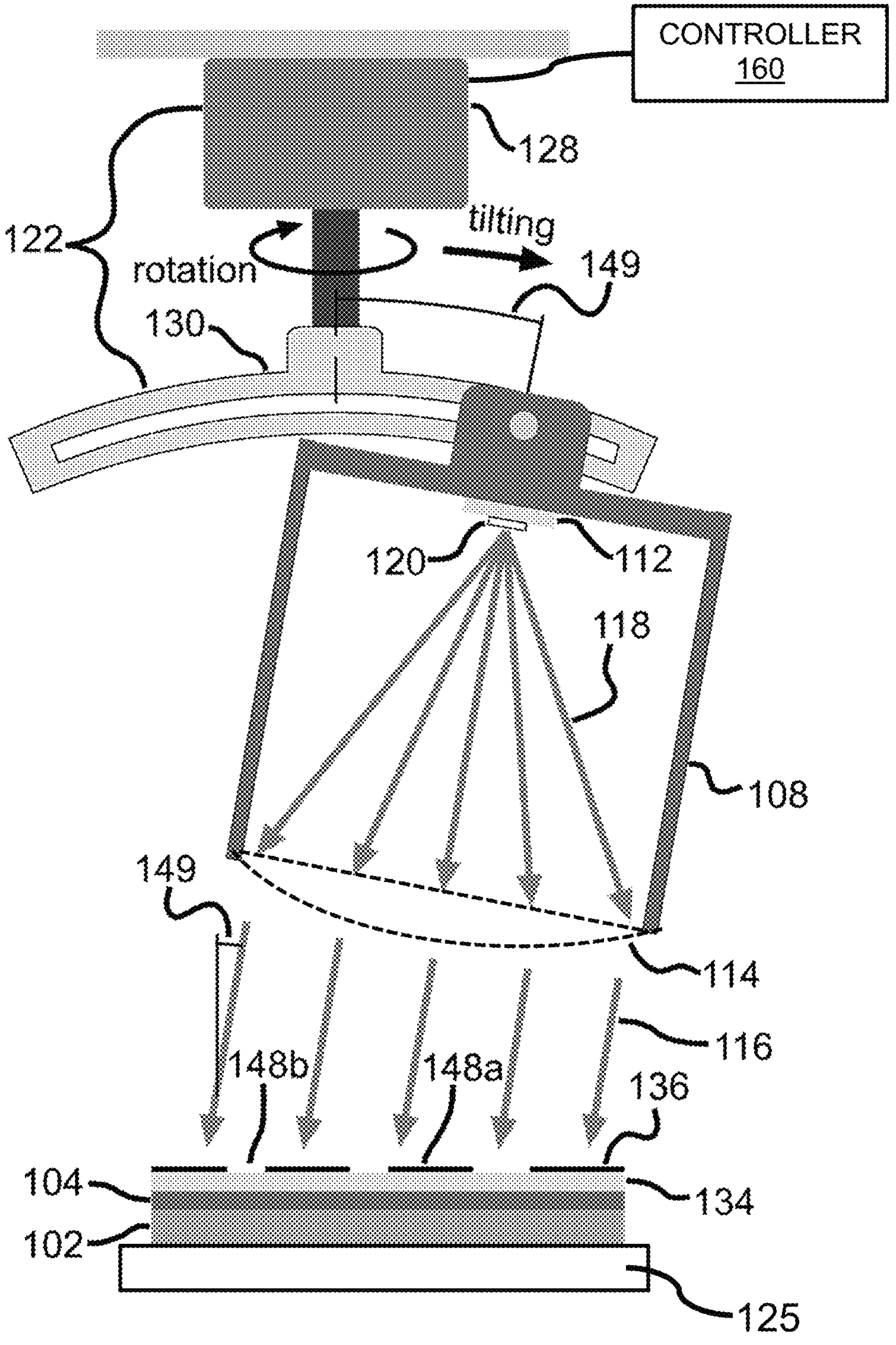
FIG. 4 is an illustration a photolithography system according to still another embodiment of the inventive system.

The apparatus 100 includes a support assembly 122 for movably positioning the optical assembly 108 relative to the substrate mount 102, such that the collimated light beam 116 is directable at the illumination area 106 at variable and controllable directions and angles. Support assembly 122 sits is supported on a stable, flat support surface by a base 125, and, depending on the embodiment, may be fixed or moveable relative to base 125. The support assembly 122 components comprise a rotating support 128 having an axis of rotation, and an adjustable angle mount 130 for directing the collimated light beam 116 at the variable and controllable directions and angles upon the illumination area 106. In the embodiment of FIG. 2, support assembly 122 causes substrate mount 102 to both tilt and rotate relative to base 125. As shown in FIG. 3, in this embodiment, support assembly 122 causes substrate mount 102 to rotate relative to base 125, while the angle of optical assembly 108 is separately tilted relative to the flat surface (and base 125). In FIG. 4, substrate mount 102 sits fixed on base 125 while the optical assembly 108 is rotated and tilted relative to the flat surface (and base 125). Rotating support 128 and adjustable angle mount 130 may each be manually controlled, e.g., via precision micrometers, or by a combination of motors, drives, and a system controller 160, as known in the art. Controller 160 may be, for example, a special purpose computer, a motor controller board that is compatible with Raspberry Pi computers and similar commercially-available single board computers (SBCs), or a tablet, laptop, or desktop computer programmed with software to implement the motor controls, or a combination thereof.

In another embodiment, the photolithography system includes a substrate 104 with a surface 132. The surface 132 of the substrate 104 will preferably be treated for low reflectivity at the wavelengths of the light source 112. The substrate 104 may be a polished wafer, such as a silicon or glass wafer, with an antireflection (AR) coating for the wavelengths of the light source 112. According to the present invention, the substrate 104 may be a substrate which is often used in R&D settings and for making masters for molding microfluidic devices and microwell arrays, which is a silicon wafer with a diameter between 3 inches and 6 inches (7.5 cm and 15 cm). In other embodiments, the substrate 104 is made of glass and has a thickness in the range of standard #1, #1.5, and #2 microscope cover glasses.

A UV-light-sensitive material 134 is disposed on the surface 132 of the substrate 104. In some embodiments, the surface of the substrate, which the UV-light-sensitive material 134 is positioned upon, is flat and the UV-light-sensitive material positioned on the substrate has a uniform or near uniform thickness. In other embodiments, UV-light-sensitive material is a UV-curable material, e.g., a UV-curable epoxy, a UV-curable photoresist, or a negative photoresist. In some embodiments, the negative photoresist is a liquid photoresist from the SU8 family by Kayaku Advanced Materials (Westborough, MA, USA). In other embodiments, the negative photoresist is a flexible thin sheet (laminate), e.g., an epoxy dry films photoresist sheet of the SUEX® or ADEX™ type by DJ MicroLaminates, Inc. (Sudbury, MA, USA), which is deposited on the surface 132 of the substrate 104 (e.g., a silicon or glass wafer) by lamination.

An exposure of a negative photoresist to a sufficient dose of UV-light promotes curing, cross-linking, polymerization, or solidification of the negative photoresist. After appropriate subsequent thermal treatment (e.g., baking in an oven or on a hot plate), the negative photoresist becomes insoluble in certain solvents that would normally dissolve this photoresist. When a substrate 104 with a layer of a negative photoresist 134 is developed, the photoresist remains intact and remains on the substrate in regions that had been exposed to a sufficient dose of UV-light (and thermally treated afterwards), whereas portions of the negative photoresist that had been exposed to a less than sufficient dose of UV-light are dissolved (or otherwise removed from the substrate) with the developer.

A photomask 136 is positioned in the illumination area 106 on the path of the collimated light beam 116 towards the UV-light-sensitive material 134. The photomask 136 has a patterned area with a pattern of opaque regions 148*a* and transparent regions 148*b* and may be positioned in a fixed position with respect to the substrate 104. In some embodiments, there is a space between the photomask and the free surface of the UV-light-sensitive material 134, and the space is filled with a liquid to reduce divergence of the UV-light after it passes through transparent regions 148*b* of the photomask 136. When the UV-light-sensitive material 134 is a UV-curable material (e.g., a negative photoresist), its exposure to the collimated light beam 116 through the transparent regions 148*b* of the photomask 136 promotes the generation microstructures of the UV-curable material that have contours defined by the pattern of transparent regions 148*b* on the photomask 136.

The photomask 136 may be attached to a photomask holder 138. The substrate mount 102 and the photomask holder 138 may be parts of a mask-aligner 140 having a stage 142 configured minimally for X-Y translation and preferably for X,Y,Z translation and rotation stage 144. The mask aligner 140 makes it possible to move the photomask 136 and the substrate 104 with respect to each other along all directions and to rotate the photomask 136 and the substrate 104 with respect to each other in the plane of the photomask 136.

According to some embodiments, more than one-third of the power of the UV-light in the collimated light beam 116 incident upon the patterned area of the photomask emanates from the luminous area 120 of the light source 112, and the luminous area 120 of the light source 112 has a diameter of less than one-third of the diameter of the collimated light beam 116. According to the present invention, the support assembly 122 components, comprising the rotating support 128 and the adjustable angle mount 130, direct the collimated light beam 116 toward the photomask at variable and controllable directions, and at variable and controllable tilt angles 149, the tilt angle 149 being the angle between the direction of the collimated light beam 116 and the direction orthogonal to the plane of the photomask 136.

In one embodiment, light collimator 114 comprises one or more lenses disposed along a common optical axis for generating a collimated light beam 116 with a spatially uniform light intensity across the beam that illuminates the patterned area of the photomask 136. While illustrated diagrammatically in FIGS. 2-4 as a single lens (indicated with dashed lines), in an exemplary embodiment, and as shown in the prototype assembly in FIGS. 7-8, the light collimator 114 comprises two plano-convex glass lenses with diameters of 75 mm and 200 mm (114*b*) (proximal and distal lens, respectively). The optical assembly 108 thus includes a frame or support structure for stably mounting the lens(es) of the collimator 114 at fixed spacings from each other as well as to light source 120. The effective ratio between the diameter of the luminous area of the light source and the effective distance between the luminous area and the distal 200 mm lens (114*b*) is ~0.008. (The effective diameter of the luminous area is the diameter of its virtual image created by the proximal lens, and the effective distance between the luminous area and the distal lens is the distance between the virtual image of the luminous area and the distal lens.) The collimated light beam diverges by less than 0.01 radian (full width at half height) over a cross-section of an approximately 5 inch (12.5 cm) diameter circle. In some embodiments, the diameter of lens 114*b* is at least 70 mm.

In some embodiments, the lenses of light collimator 114 may be treated with an antireflection (AR) coating for the wavelengths of UV-light. In other embodiments, one or more lenses of light collimator 114 may be a Fresnel lens made of a material transparent to UV-light. In still other embodiments, one or more of lenses of light collimator 114 may be plano-convex, double convex, or meniscus lenses made of UV-transmissive material, including glass, fused silica, or another appropriate material.

As described herein, substrates often used in R&D settings and for making masters for molding microfluidic devices and microwell arrays have diameters between ~7.5 cm and ~15 cm (between ~3 to ~6 inches). Thus, the preferred collimated beam 116 evenly illuminates the relatively large areas of wafers of these sizes. Furthermore, the high collimation of the beam, which is needed for high-quality UV-photolithography, favors beams of large diameters, as produced by light source with small diameters of the luminous areas 120 that are placed at large effective distances from the collimating lenses.

Systems for photolithographic generation of tilted microstructures are known. However, these systems employ arc lamp light sources (non-LED) or, alternatively, arrays of LEDs that spread over the area comparable to the cross-section of the UV-light beam and use collimators with collimating lenses aligned along multiple optical axes. The system described herein having a light source 112 with a compact luminous area 120, which can be within a single assembled LED device, and having a collimator with a set of coaxial lenses and with the distal plano-convex lens with a diameter of greater than 70 mm and as large as 200 mm, producing a single collimated beam of light illuminating the entire illumination area 106 and the entire patterned area of the photomask 136, are important features of the inventive system described herein. In some embodiments, the collimator 114 has a proximal plano-convex lens, 75 mm in diameter, which enables more efficient collection of light. A preferred light source is a UV LED with the central wavelength between 350 nm and 405 nm. In some embodiments, the light source has a central wavelength between 360 and 375 nm. In an exemplary embodiment, the divergence of the beam is 0.01 radian (full width at half height; excluding the diffraction effects) and the non-uniformity of the characteristic direction of the beam (and deviation of the characteristic direction from the orthogonal to the plain of the photomask) is ±0.005 radian over a circle with a diameter of approximately 5 inches (12.5 cm). The variation of the UV-light intensity is ~6% peak-to-peak over an approximately 5 inch (12.5 cm) diameter circle and ~8% peak-to-peak over an approximately 5.5 inch (14 cm) diameter circle.

In some embodiments, the spatially uniform light intensity is the intensity that varies by less than 8% peak-to-peak across the beam and the collimated beam diverges by less than 0.03 rad, using full width at half-height criterion, and diameter of the collimated beam 116 with spatially uniform light intensity across the beam is at least 50 mm. In other embodiments, the spatially uniform light intensity is the intensity that varies by less than 8% peak-to-peak across the beam, and the collimated beam diverges by less than 0.02 rad, using full width at half-height criterion, and diameter of the collimated beam with spatially uniform light intensity across the beam is, at least, 85 mm.

In still other embodiments, the spatially uniform light intensity is the intensity that varies by less than 8% peak-to-peak across the beam, and the collimated beam diverges by less than 0.01 rad, using full width at half-height criterion, the non-uniformity of the characteristic direction of the beam is ±0.005 radian over a circle with a diameter of approximately 5 inches (12.5 cm), and diameter of the collimated beam with spatially uniform light intensity across the beam is at least 135 mm.

According to one embodiment, the rotating support 128 is affixed to one of the substrate mount 102 or the optical assembly 108. According to this embodiment, the adjustable angle mount 130 is affixed to one of the substrate mount 102 or the optical assembly 108, independent of the affixation of the rotating support 128. Each of the rotating support and angle mounts may be manually adjusted, or they may incorporate appropriate motors and drives controlled by one or more controller 160. Controller 160 may be, for example, a special purpose computer, a motor controller board that is compatible with Raspberry Pi computers and similar single board computers (SBCs), or a laptop or desktop computer programmed with one or more applications to implement the motor controls, or a combination thereof.

Figure 7:
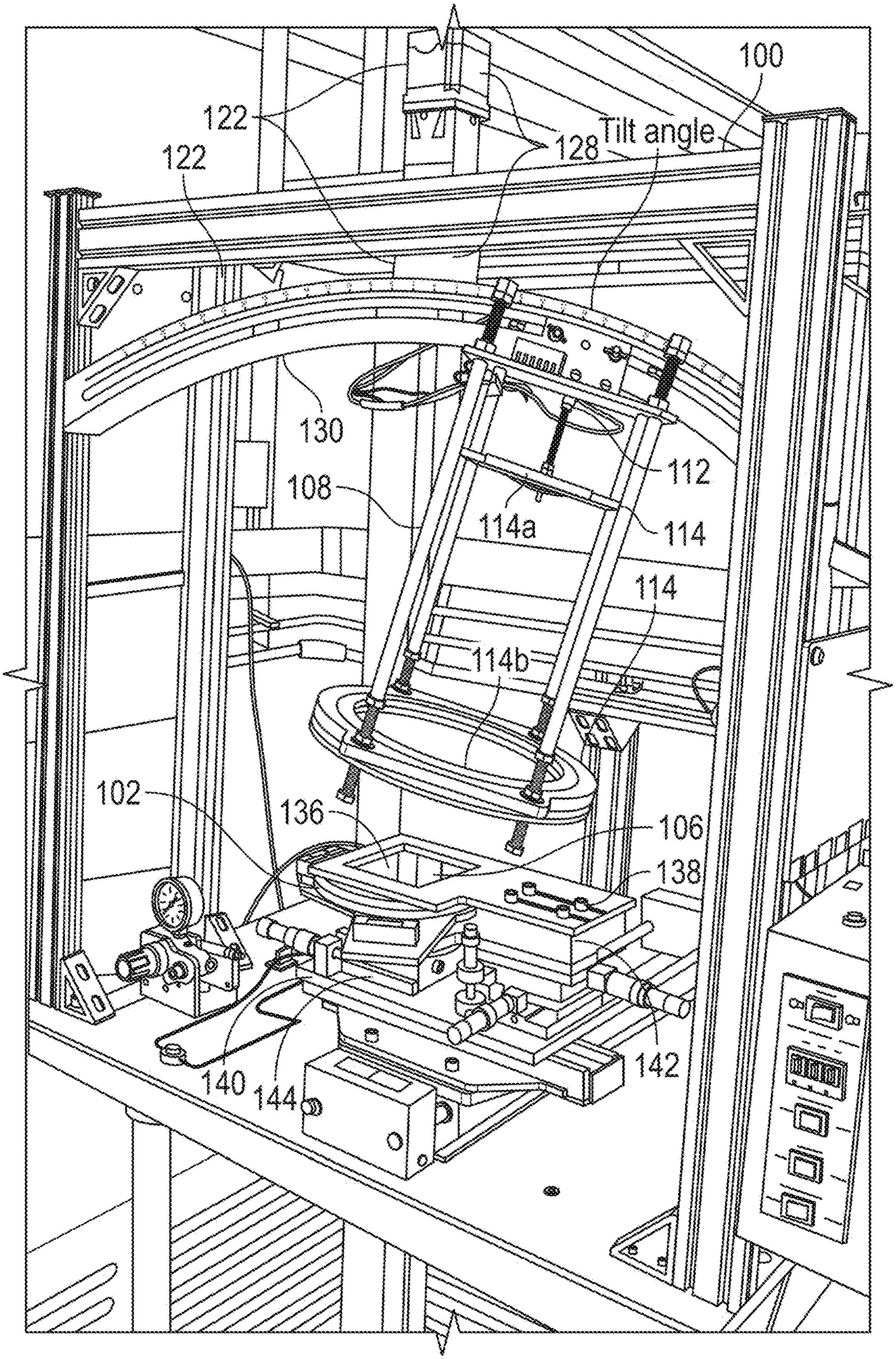
FIG. 7 is a photograph of a prototype system for UV-lithography according to one embodiment of the inventive system.
Figure 8:
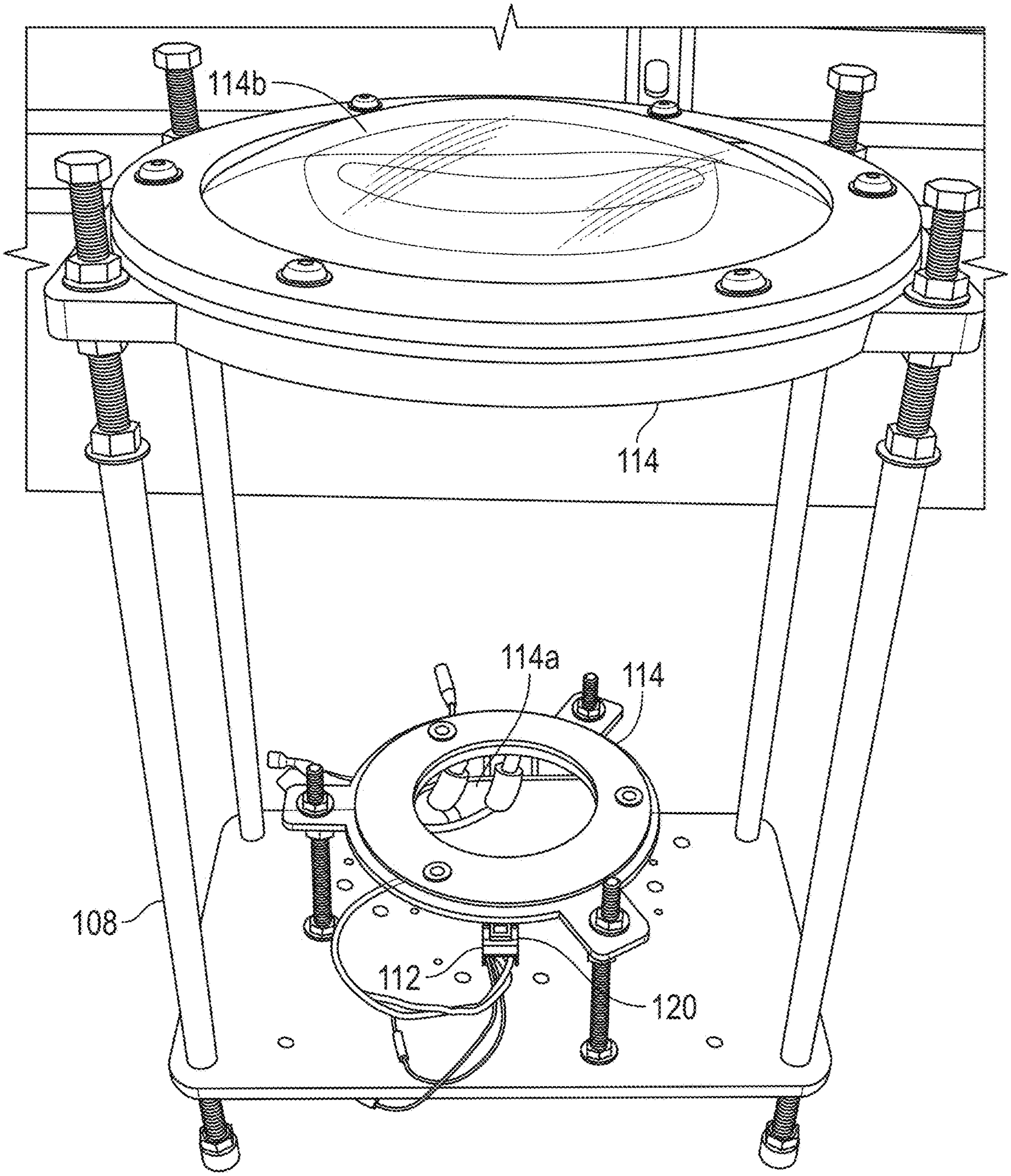
FIG. 8 is a photograph of the optical assembly of the prototype system shown in FIG. 7.

There are two basic approaches to implement changing the direction of the collimated light beam 116 with respect to the plane of the photomask (and the substrate mount), with the beam coming at a constant tilt angle 149: (1) keeping the substrate mount 102 motionless, while rotating the optical assembly 108, and (2) keeping the optical assembly 108 motionless, while rotating the substrate mount 102. Examples of embodiments with the former type of implementation are shown in FIG. 4 and FIG. 7. Examples of embodiments with the latter type of implementation are shown in FIGS. 2 and 3. A mixture of these approaches may also be used.

Figure 5:
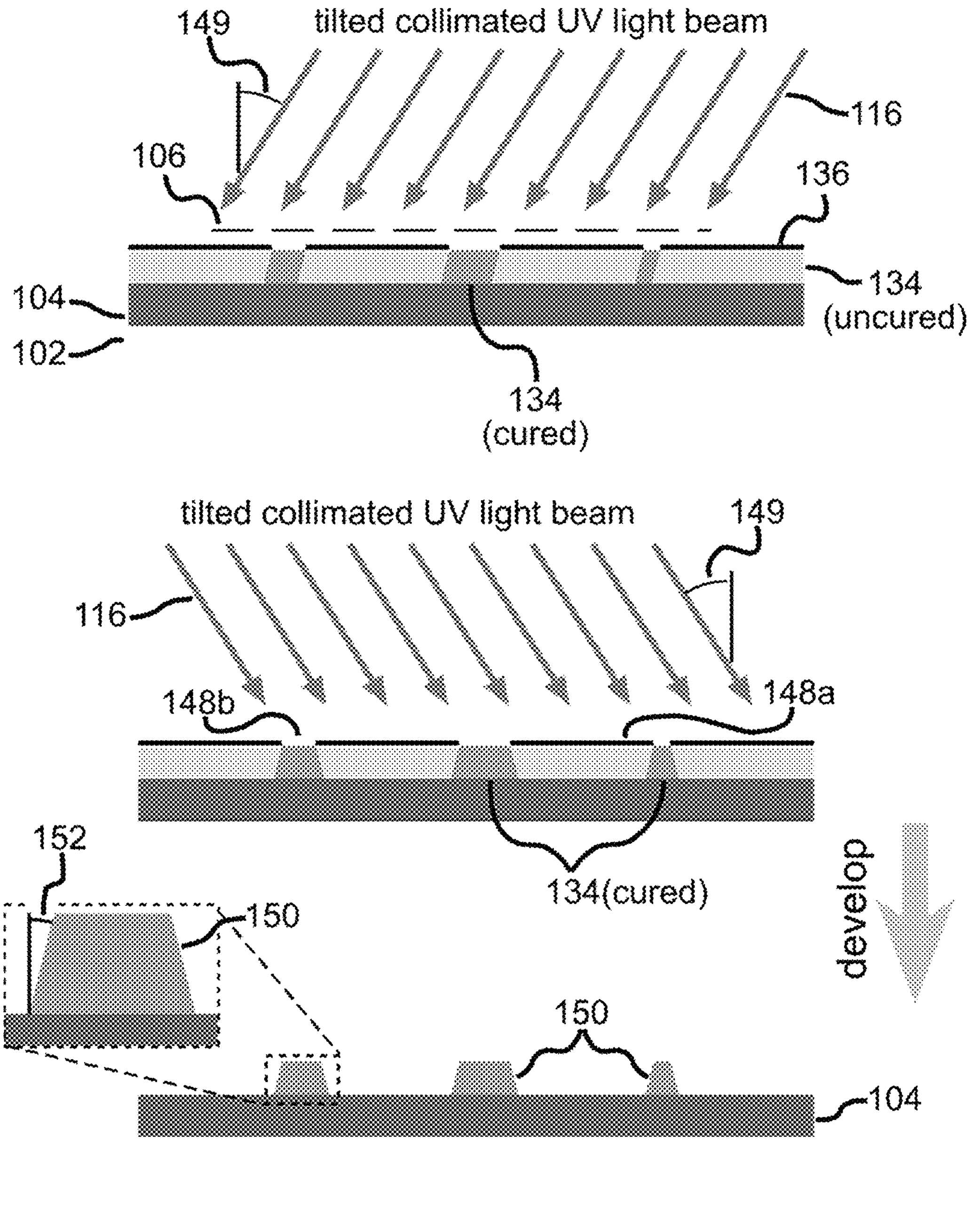
FIG. 5 is a diagram illustrating a process for making lithographically fabricated microstructures with a draft angle in a UV-curable material, including two UV-light exposures to tilted collimated light beams and subsequent development, according to one embodiment of the inventive method.
Figure 6:
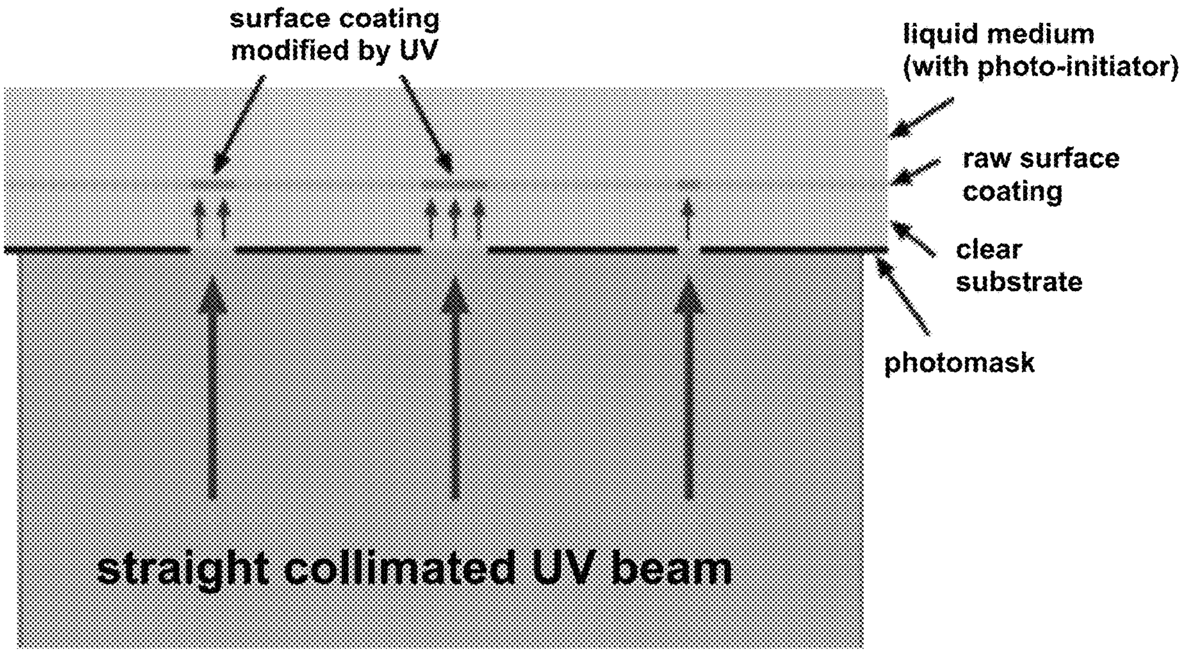
FIG. 6 is an illustration showing one embodiment of micro-patterning using a highly collimated beam according to one embodiment of the disclosure.
Figure 9:
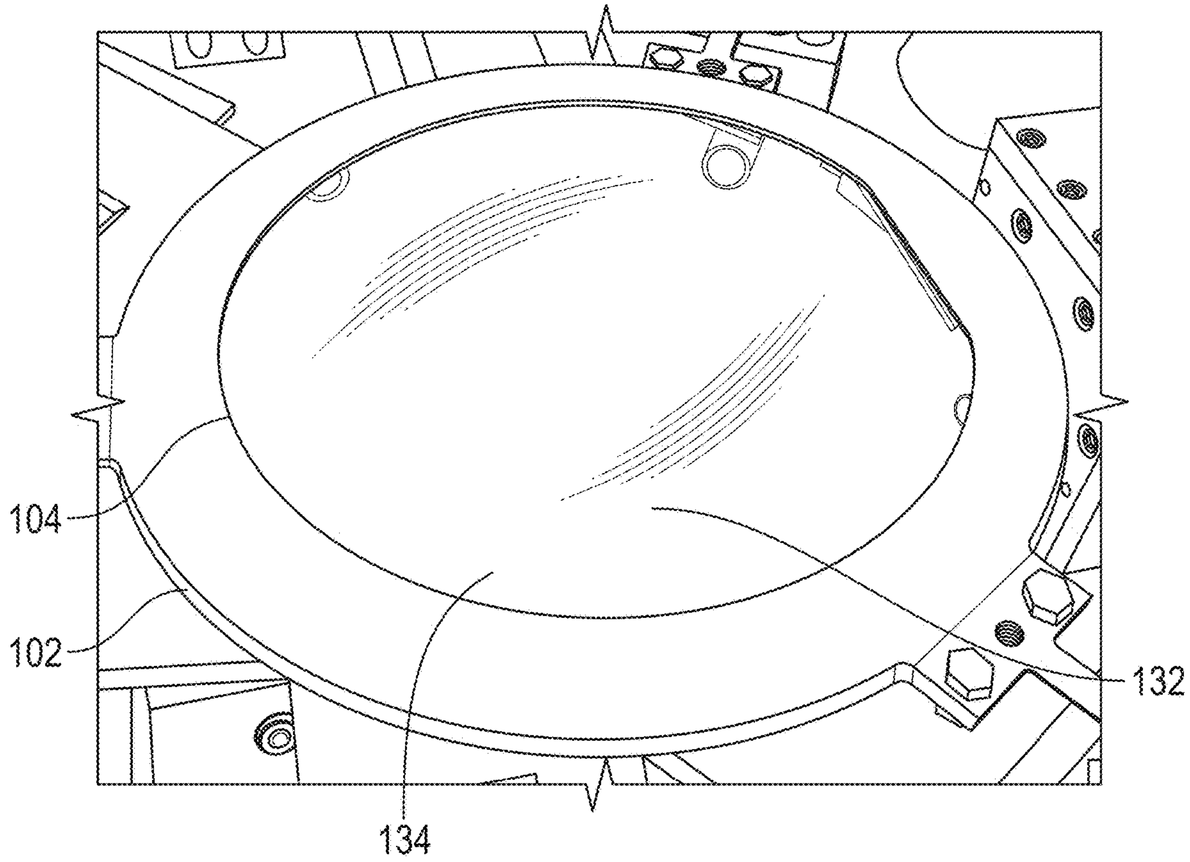
FIG. 9 is a photograph of the substrate mount with the substrate (silicon wafer) with a layer of UV-light-sensitive material on it of the prototype system shown in FIG. 7.

There are two basic approaches to implement changing the tilt angle 149. The first approach is keeping the orientation of the substrate mount 102 unchanged, while adjusting the orientation of the optical assembly 108 and the direction of the collimated light beam 116 with respect to the orthogonal to the plane of the substrate mount 102 (and the plane of the photomask 136). Examples of embodiments with this implementation are shown in FIGS. 5, 6, and 9. For this implementation, the axis of rotation of the rotating support 128 is preferably orthogonal or near orthogonal to the plane of the photomask 136. The second approach is changing the orientation of the plane of the substrate mount 102 (and of the plane of the photomask 136). An example of an embodiment with an implementation of this approach is shown in FIG. 2. For this implementation, the axis or rotation of the rotating support 128 is preferably parallel or near parallel to the direction of the collimated light beam 116. A mixture of these two approaches may also be used.

In the embodiments of FIGS. 2-4 and FIG. 7, the degree by which the direction of the collimated light beam 116 changes, when the rotating support is moved through a given angle, is proportional to the tilt angle (becoming zero for zero tilt angle). On the other hand, the direction of the orthogonal projection of a vector directed along the collimated light beam 116 upon the plane of the photomask, which is the vector in the plane of the photomask, is more closely related to the position of the rotating support. Regardless of the tilt angle (as long as it is not zero, making the projection zero as well), the direction of this projection changes by the same angle as the angle by which the rotating support is moved. In particular, when the rotating support is moved by 360°, the direction of the projection of the vector along the collimated light beam upon the plane of the photomask changes by 360° as well. This last statement is also true in the general case, when the axis of rotation is neither orthogonal to the plane of the photomask (as in FIGS. 3, 4, and 7) nor parallel to the collimated light beam (as in FIG. 2).

According to one embodiment, the optical assembly 108 is affixed to the adjustable angle mount 130 and the collimated light beam 116 is directable at variable and controllable tilt angles 149 by adjusting the position and orientation of the optical assembly 108 on the angle mount 130. According to this embodiment, the optical assembly 108 may be affixed to the rotating support 128 and the different directions of incidence of the beam of light upon of the photomask are implemented by turning the rotating support 128 around the axis of rotation.

In the embodiment of the system 100 shown in FIG. 7, the rotating support 128 and adjustable angle mount 130 are both affixed to the optical assembly 108 to allow for adjusting the tilt angle 149 between 0 and 30° and for continuously rotating the optical assembly 108 by 360°.

A draft angle in the microstructures of cured UV-curable material in a selected direction is achieved by setting the tilt angle proportional to the draft angle and making two exposures, wherein each exposure provides the sufficient dose of UV-light to promote the curing of the UV-curable material. The rotating support 128 is moved around the axis of rotation by 180° between the two exposures. As a result of this movement by 180°, the projection of the vector directed along the beam upon the plane of the photomask changes its direction by 180°. As described herein, with respect to certain embodiments, the coefficient of proportionality between the draft angle and tilt angle scales inversely with the refractive index of the UV-curable material.

A certain draft angle in the microstructures of cured UV-curable material in all directions is achieved by setting the tilt angle 149 proportional to the draft angle, and moving the rotating support 128 around the axis of rotation by a plurality of angles, covering a range close to 360° or more than 360°, to direct the collimated light beam 116 upon the photomask from a plurality of directions (and sides). When the vectors along the direction of the light beam are projected upon the plane of the photomask for this plurality of angles of rotation (and the plurality of the corresponding directions of the light beam), the directions of the vector projections cover a range close to 360° or more than 360°. In some embodiments, the rotating support 128 is moved by 360° or a multiple of 360° at an even angular velocity for a cumulative duration of time that provides a sufficient dose of UV-light exposure to promote the curing of the exposed portions of the UV-curable material.

Referring now to FIG. 5, an example of a process of making a lithographically fabricated microstructures 150 of cured UV-curable material 134 with draft angles 152 and trapezoidal profiles tapered towards the top on a flat substrate 104 (most commonly, a polished silicon wafer) is shown. This substrate with the microstructures on its surfaces, or a copy of the substrate with the microstructures may be used as a master for molding or embossing. A good practical option for making masters is to fabricate the microstructures with equal draft angles in all directions, e.g., by setting a fixed tilt angle 149 and by moving the rotating support 128 by 360° or a multiple of 360° at an even angular velocity. Because microstructures of a UV-cured epoxy on a flat substrate may be subject to delamination from the substrate and mechanical degradation, a copy of the substrate can be made in monolith epoxy, metal-infused epoxy or metal. To this end, a negative replica of the substrate with the microstructures can be molded or embossed in a flexible material, e.g., polydimethylsiloxane (PDMS), and then a negative replica of this negative replica, which is a positive replica of the original substrate with the microstructures, can be made in a monolith material. This positive replica, a copy of the original master, can serve as a durable secondary master for molding or embossing.

The embossing and molding, with either primary or secondary molds, can be done in hard thermoplastics, thermoplastic elastomers, or silicone elastomers, creating embossed and molded parts. Embossed and molded parts with micro-channels or microwells on the surface can be used for microfluidic devices or microwell array devices.

According to another embodiment, the transparent regions on the photomask form an array of polygons or circles, the UV-photolithography is performed to produce draft angles in all directions, as described herein, and the microstructures of the cured UV-curable material on the substrate form an array of modified polygonal frustums or conical frustums. According to a still another embodiment, the array of polygons or circles is a regular hexagonal array with equal distances between the centers of adjacent polygons or circles. According to a still another embodiment, the substrate with an array of conical frustums or modified polygonal frustums or a monolith replica of the substrate is used as a master (primary or secondary, respectively) for molding or embossing in order to make parts with arrays of conical or modified polygonal frustum microwells. The parts with the arrays of conical frustum or modified polygonal frustum microwells can be used in chemical, biochemical, or biological assays or experiments or in medical tests.

Another application of the system 100 according to the present invention is a process of contact UV-photolithography, wherein a UV-light-sensitive material is disposed on a thin transparent flat substrate and the photomask is applied to the side of the substrate without the UV-light-sensitive material on it. The beam of light is aimed at the photomask with the exposure maintained for a duration of time that provides a sufficient dose of UV-light exposure through transparent areas of the photomask, where the sufficient dose is sufficiently high to induce photochemical modification in the exposed regions of the UV-light-sensitive material.

In one embodiment, the photochemical modification results in curing or polymerization of the UV-light-sensitive material and protects it from dissolving or causes the UV-light-sensitive material to adhere to the surface of the substrate more strongly than in regions where the dose of exposure was less than sufficient. In another embodiment, the photochemical modification makes UV-light-sensitive material more soluble in certain solvents or causes the UV-light-sensitive material to adhere to the surface of the substrate less strongly. After the photochemical modification, the UV-light-sensitive material may be post-processed and developed by applying thermal and chemical treatments to the layer of the UV-light-sensitive material to make the UV-light-sensitive material selectively dissolve or detach from the substrate in the regions where the dose of the UV-light exposure was less than the sufficient, or alternatively, to make the UV-light-sensitive material selectively dissolve or detach from the substrate in the regions where the dose of the UV-light exposure was greater than the sufficient dose. In some embodiments, the UV-light-sensitive material is a photoresist, such as one of the SU8 family of negative photoresists, as an example.

According to another embodiment of the present invention, the solidification, cross-linking, curing, or polymerization of liquid pre-polymers of the UV-curable hydrogels and UV-curable silicone gels and elastomers deposed on a transparent thin substrate into photo-lithographically defined solid microstructures is provided. The thickness of the solidified gel or elastomer layer can be controlled by spin-coating, by using a wire-wound metering rod, or by placing spacers on top to the substrate, covering the pre-polymer layer with a solid cover that has a non-sticky surface, and removing the cover after the UV-light exposure and solidification are complete. The inventive system and process will be particularly advantageous for thicker layers of the gels and elastomers because of the small divergence of the collimated light beam.

In a still another embodiment, the layer of UV-light-sensitive material is a molecular coating of UV-light-sensitive molecules and, upon sufficient exposure, the photochemical modification makes these molecules dissolve or detach from the surface of the substrate. In a still another embodiment, the layer of UV-light-sensitive material is also a molecular coating of UV-light-sensitive molecules and, upon sufficient exposure, the photochemical modification makes these molecules adhere to the surface of the substrate more strongly than in regions where the dose of exposure was less than sufficient. In both embodiments of this paragraph, the resulting substrate has a molecular micro-pattern on its surface at the end of the process.

In some embodiments, the layer of a UV-light-sensitive material and UV-light-sensitive molecular coating can be immersed in a liquid medium.

The resulting substrate with a micro-pattern in a molecular coating may be eventually used as a substratum for plating adherent biological cells. The substrate may be made of glass or transparent plastic with a thickness in the range of the standard #1, #1.5, and #2 microscope cover glasses for optimum compatibility with the standard microscope objective lenses.

FIG. 6 shows an example of application of the inventive system and method for micro-patterning of transparent thin substrates (e.g., microscope cover glasses or thin plastic sheets) that can be used for adherent cell cultures. This micro-patterning can be performed by (1) coating one side of the substrate with some UV-light-sensitive material, (2) exposing selected areas of the substrate to UV-light from the side without the coating, thus causing the material to change its properties in these selected areas, e.g., degrading and detaching from the surface or, alternatively, becoming more firmly attached to the surface. Importantly, with the UV illumination from the side without the UV-light-sensitive material (bottom side), the UV-induced photochemical modification can occur without direct contact between the photomask and the UV-light-sensitive material, and with the UV-light-sensitive material immersed a liquid medium.

In another embodiment, this micro-patterning can be performed by (1) coating one side of the substrate with UV-light-sensitive molecules, (2) exposing selected areas of the substrate to UV-light from the other side, thus causing the UV-light-sensitive molecules to degrade or detach from the substrate or, alternatively, causing the UV-light-sensitive molecules to become more firmly attached to the substrate. Importantly, with the UV-light beam coming from the side without the UV-light-sensitive material or molecular coating, photochemical modification can occur with the UV-light-sensitive material or molecules immersed in a liquid medium and can be facilitated by light-sensitive molecules present in the liquid medium.

According to another embodiment, a photolithography system for producing arrays of microwells with shapes of conical frustums or modified polygonal frustums is provided. The system comprises a substrate mount 102 configured to receive a substrate 104 with a layer of light-curable material 134 on the surface of the substrate 104; an optical assembly 108, producing a collimated light beam 116 with spatially uniform intensity of light across the beam, and directing the collimated light beam 116 to an illumination area 106 proximate to the substrate mount 102; a support assembly 122 for movably positioning the optical assembly 108 relative to the substrate mount 102 such that the collimated light beam 116 is directable at substrate mount 102 at variable and controllable directions and angles of incidence.

The optical assembly comprises a light source 112 and a collimator 114 in optical connection with the light source 112, the collimator being capable of receiving the light from the light source 112 and generating the collimated light beam 116. The light source 112 may comprise one or more arc lamps (e.g., high-pressure mercury lamps), LEDs, or incandescent lamps, and its luminous area may have a dimeter smaller, comparable, or greater that the diameter of the collimated light beam. The collimator 114 may have one or more sets of coaxial lenses. The surface of substrate 104 is preferably treated for low (minimal or no) reflectivity of the UV light emanating from the light source 112. The photomask 136 has a patterned area with a pattern of opaque 148*a* and transparent regions 148*b*, where the transparent regions form an array of circles or polygons, is positionable in a fixed position with respect to the substrate 104, and on the path of the collimated light beam 116 towards the light-curable material 134. The exposure of the light-curable material to the collimated light beam promotes curing, cross-linking, polymerization, or solidification of the light-curable material, making the light-curable material less soluble in certain solvents. The curing, cross-linking, polymerization, and solidification may require a thermal or chemical treatment to complete. According to one embodiment, the light-curable material is a light-curable epoxy or light-curable photoresist. According to another embodiment, the collimated light beam 116 is a UV-light beam or has a considerable UV-light component, and the light-curable material is a UV-light curable material, such a UV-curable epoxy or a negative (UV-curable) photoresist.

The support assembly 122 comprises an adjustable angle mount 130 for directing the collimated light beam 116 at different controllable tilt angles 149, the tilt angle being the angle between the direction of the light beam and the direction orthogonal to the plane of the photomask, and a rotating support 128 for rotating the optical assembly and changing the direction of incidence of the collimated light beam 116 upon a photomask. The rotating support 128 may be affixed to the optical assembly 108 or to the substrate mount 102. The adjustable angle mount 130 may be affixed to the optical assembly 108 or to the substrate mount 102.

A method of making a substrate with an array of lithographically defined microstructures with shapes of conical or modified polygonal frustums to produce arrays of microwells with shapes of conical or modified polygonal frustums using the system according to this embodiment of the photolithography system is provided. The method comprises preparing the surface of a substrate 104 by positioning a layer of a light-curable material 134 on the surface of the substrate. A photomask 136 with transparent regions forming an array of circles or polygons is placed in a fixed position with respect to the substrate in the illumination area 106 on the path of the collimated light beam 116 towards the light-curable material 134. The collimated light beam 116 is directed towards the photomask at a first direction and at a tilt angle to expose the light-curable material 134 through the transparent areas of the photomask 148*b* to the collimated light beam 116 at the first direction and tilt angle. The collimated light beam 116 directed at the photomask 136 is maintained at the first direction and tilt angle for a duration of time, the duration of time being a sufficient time for the light from the collimated light beam 116 to promote the curing, at least in part, of the exposed portion of the light-curable material 134. The collimated light beam 116 is further directed at the photomask from a second and plurality of more directions and tilt angles to expose the light-curable material 134 through the photomask 136 at the second and plurality of more directions and tilt angles, where the second and plurality of directions and tilt angles are the same or different as the first direction and tilt angle. The collimated light beam 116 directed at the photomask 136 is maintained for the second and plurality of more directions and tilt angles, each for a duration of time which is a sufficient time for the light from the collimated light beam 116 to promote the curing, at least in part, of the exposed portion of the light-curable material. These steps of directing the collimated light beam 116 at the photomask 136 may be repeated until the desired curing or the promotion or initiation of curing of the light-curable material 134 is achieved.

According to an embodiment of the method described herein, microstructures of cured light-curable material in the shapes of conical or modified polygonal frustums are generated by setting the tilt angle 149 proportional to the cone (or polygonal frustum) opening angle and moving the rotating support 128 around the axis of rotation by a plurality of angles, covering a range close to 360° or more than 360°, to direct the collimated light beam 116 upon the photomask from a plurality of directions. In some embodiments, the rotating support 128 is moved by 360° or a multiple of 360° at an even angular velocity for a cumulative duration of time that provides a sufficient dose of light exposure to promote the curing, at least in part, of the exposed portions of the light-curable material.

Post-processing and developing the light-curable material by applying thermal and chemical treatments creates microstructures 150 of the light-curable material on the substrate. The microstructures 150 are formed in portions of the light-curable material that received a sufficient light exposure to promote the curing of the light-curable material. The microstructures 150 have the shapes of conical or modified polygonal frustums with the contours of their smaller flat surfaces defined by the transparent circles or polygons on the photomask 136. In some embodiments, as a result of the post-processing and development, the light-curable material 134 selectively dissolves or detaches from the substrate 104 in the regions where the light exposure time was less than sufficient.

According to another embodiment, the substrate with the microstructures of the cured light-curable material remaining on the substrate after post-processing and developing formed according to the systems and methods described herein, may be used as a primary master or to make secondary masters in monolith materials as copies (positive replicas) of the primary master. The primary and secondary masters may be further used for molding and embossing in order to make parts with arrays of conical frustums or modified polygonal frustum microwells. According to a still another embodiment, the molding or embossing can be done in hard thermoplastics, thermoplastic elastomers, silicone elastomers, or hydrogels. The parts with the arrays of conical frustum or modified polygonal frustum microwells can be further used in chemical, biochemical, or biological assays or experiments or in medical tests.

EXAMPLES

The following are illustrative examples of the use of an embodiment of the inventive system for the fabrication of microstructures.

Example 1. Fabrication of Microstructures

UV-photolithography microfabrication of substrates with microstructures with draft angles and of substrates with arrays of conical and modified polygonal frustums.

Figure 10:
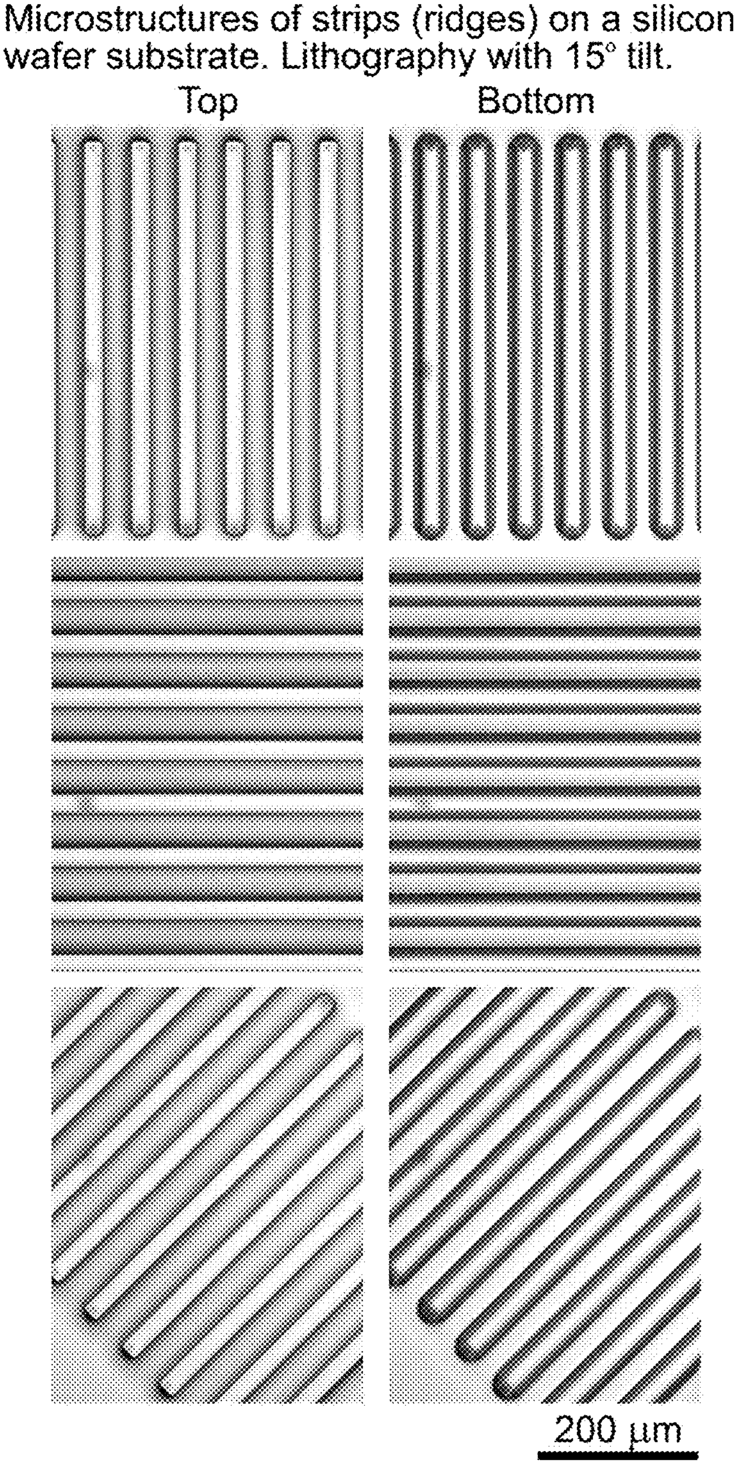
FIG. 10 is a set of images of microstructures of cured negative photoresist with the shape of strips (ridges) with a draft angle on the surface of a silicon wafer substrate that were fabricated using UV-illumination with a tilt angle of 15°.
Figure 11:
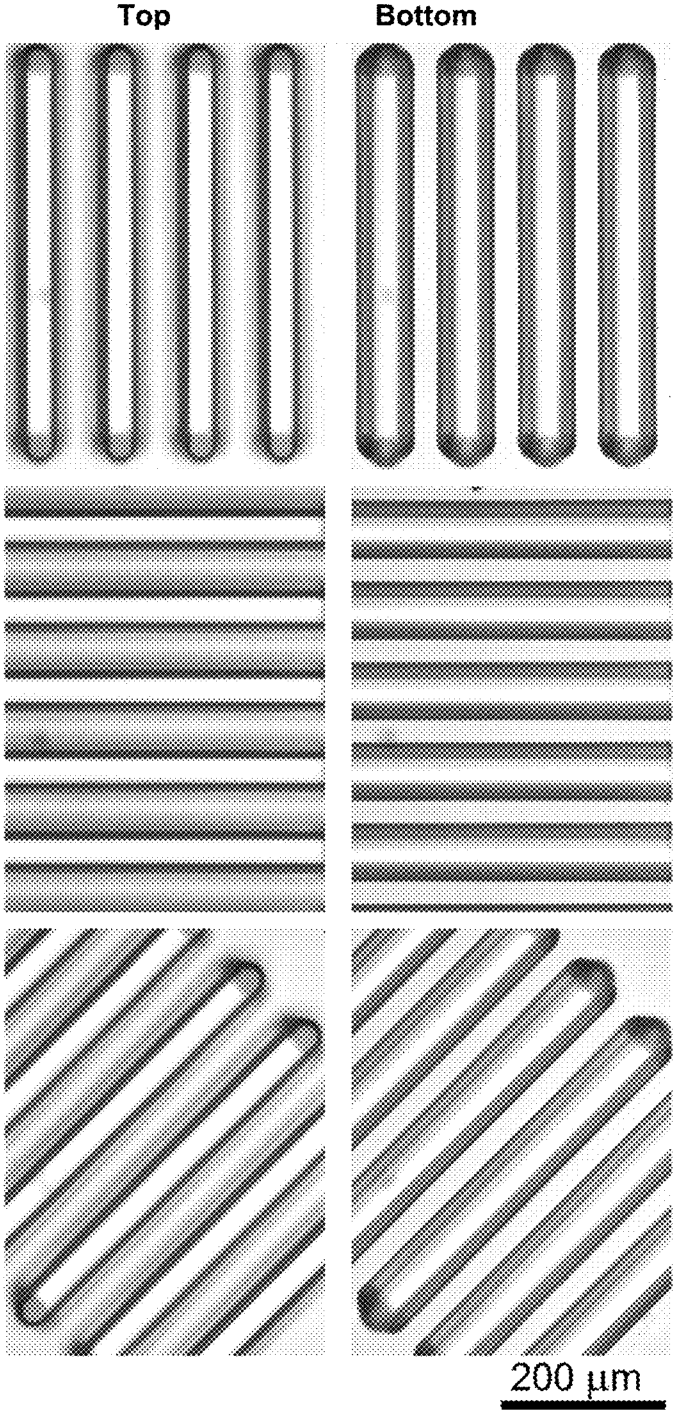
FIG. 11 is a set of images of microstructures of cured negative photoresist with the shape of strips (ridges) with a draft angle on the surface of a silicon wafer substrate that were fabricated using UV-illumination with a tilt angle of 30°.

Microstructures of cured SU8 photoresist (2050 formulation, by MicroChem, Newton, MA) on the surfaces of 5 inch (12.5 cm) silicon wafers were fabricated using the UV-photolithography system shown in FIGS. 9-11 and the methods and techniques described herein. Three 5 inch (12.5 cm) diameter polished silicon wafers were spin-coated with AZ® BARLi™ II (90 nm formulation; purchased from Integrated MicroMaterials, Argyle TX) antireflection (AR) material at 3000 rotations per minute (rpm) for 30 sec. Each of the wafers was baked on a 200° C. hot plate for 3 min to cure the AR material. Each of the wafers was subsequently spin-coated with SU8 2050 at 2000 rpm for 30 sec and baked (to evaporate the carrier solvent), first, for 3 min on a 65° C. hot plate and then for 9 min on a 95° C. hot plate, as recommended by the manufacturer. The system shown in FIGS. 9-11 was used to expose the three wafers to a collimated UV-light beam with an intensity of ~2.7 mW/cm$^2$ and a central wavelength of 365 nm through the same chrome photomask for a cumulative exposure time of 240 sec at different tilt angles, with the tilt angle maintained unchanged during the exposure time. For each tilt angle, the direction of the collimated light beam was changed by continuous rotation of the rotating support around the axis of rotation by a total of 360° at an even angular velocity (0.026 radians per sec, corresponding to the 240 sec period of rotation). The photomask had four identical clusters of transparent regions. Each cluster had (i) arrays of evenly spaced 500 μm long transparent strips of different widths, with different distances between them and different orientations, (ii) rectangular arrays of transparent squares of different sizes with different distances between the squares, and (iii) regular hexagonal arrays of circles with different diameters and different distances between the centers of the circles. At each individual UV-light exposure, two out of four clusters were exposed, while the other two clusters were blocked. As a result, each of the three wafers was exposed twice, each time through two identical clusters on the photomask, with the position of the photomask on the wafer being the same for the two exposures. The tilt angles for the three wafers were, 0 and 6°, 10° and 20°, and 15° and 30°. After the two UV-light exposures, each wafer was post-baked, first, for 1 min on a 65° C. hot plate and then for 9 min on a 95° C. hot plate, as recommended by the manufacturer, and developed using 1-Methoxy-2-propyl acetate as the developer.

The developed wafers were cleaned with isopropanol and their surfaces were passivated by vapor-phase treatment with Trimethylchlorosilane (TMCS, by Thermo Fisher Scientific). The microstructures of UV-cured SU8 2050 on the surfaces of the wafers were imaged under bright-field illumination on an upright inspection (reflected light) video microscope (Olympus BH2) equipped with a B/W USB camera (Chameleon 2 by Teledyne FLIR, Santa Barbara, CA) using a 10×/0.25 objective lens. The microscope was usually focused either at the top of the microstructures or the bottom of the microstructures (the surface of the wafer). The image contrast was enhanced by digital processing. The height of the microstructures was measured under the microscope at ~85 μm.

FIG. 10 shows cured SU8 microstructures with the shapes of strips (ridges) resulting from the exposure at a tilt angle of 15° through arrays of 20 μm wide transparent strips on the photomask that were oriented along the x- and y-axes and also at 45° with respect to the x- and y-axes. The width of the ridges was 25 μm at the top and 45 μm at the bottom (the surface of the wafer), corresponding to a draft angle of ~7° (combined taper angle of ~14°). The width of the cured SU8 ridges at the bottom and the draft angle were both independent of the orientation of the strips on the photomask (and of the ridges on the substrate), indicating that the draft angle was the same in all directions.

In FIG. 11, cured SU8 microstructures with the shapes of strips (ridges) are shown that resulted from the exposure at a tilt angle of 30° through arrays of 20 μm wide transparent strips on the photomask that were oriented along the x- and y-axes and also at 45° with respect to the x- and y-axes. The width of the ridges was 30 μm at the top and 73 μm at the bottom (the surface of the wafer), corresponding to a draft angle of ~14° (combined taper angle of) ~28°. The width of the cured SU8 ridges at the bottom and the draft angle were both independent of the orientation of the strips on the photomask (and of the ridges on the substrate), indicating that the draft angle was the same in all directions. The larger width of the ridges of cured SU8 at the top as compared with the width of the strips on the photomask, 25 and 30 μm, respectively, for the 15 and 30° tilt angles was likely due to a finite distance between the photomask and the top of the SU8 layer on the wafer. The distance was estimated at ~12 μm.

Figure 12:
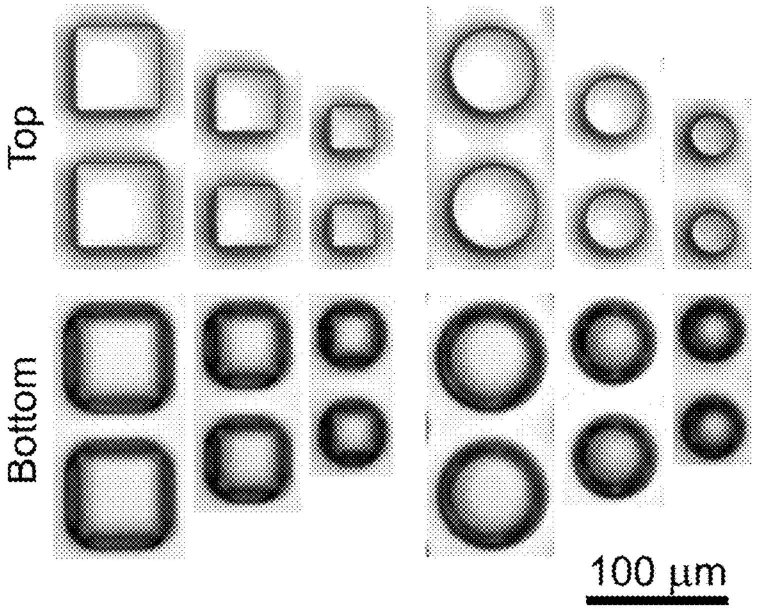
FIG. 12 is a set of images microstructures of cured negative photoresist with shapes of conical and modified polygonal (square) frustums on a silicon wafer substrate that were fabricated using UV-illumination with a tilt angle of 15°.

FIG. 12 shows cured SU8 microstructures with the shapes of modified square frustums and conical frustums that resulted from the exposure at a tilt angle of 15° through transparent regions on the photomask that were arrays of 56, 40, and 28 μm size squares and 56, 40, and 28 μm diameter circles. The draft angle was estimated by measuring the diameters of the microstructures at the top and bottom and was found to be ~7°, corresponding to ~14° cone opening (taper) angle. The cross-sections of the modified square frustums were near square at the top and became rounded octagonal near the bottom.

Figure 13:
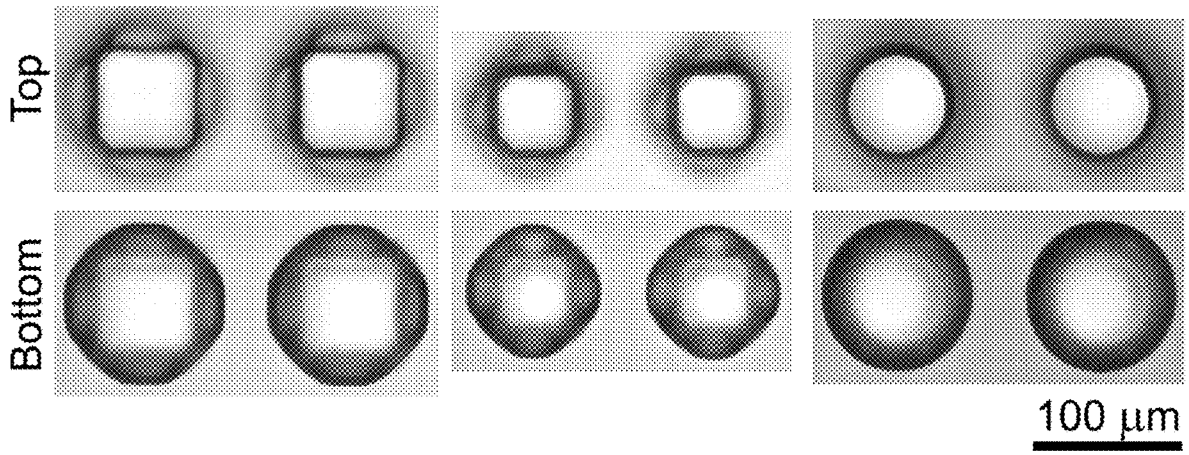
FIG. 13 is a set images of microstructures of cured negative photoresist with shapes of conical and modified polygonal (square) frustums on a silicon wafer substrate that were fabricated using UV-illumination with a tilt angle of 30°.

In FIG. 13, cured SU8 microstructures with the shapes of modified square frustums and conical frustums are shown that resulted from the exposure at a tilt angle of 30° through transparent regions on the photomask that were arrays of 56 and 40 μm size squares and 56 μm diameter circles. The draft angle was estimated by measuring the diameters of the microstructures at the top and bottom and was found to be ~14°, corresponding to ~28° cone opening (taper) angle. The cross-sections of the modified square frustums were near square at the top and became rounded octagonal near the bottom.

Figure 14:
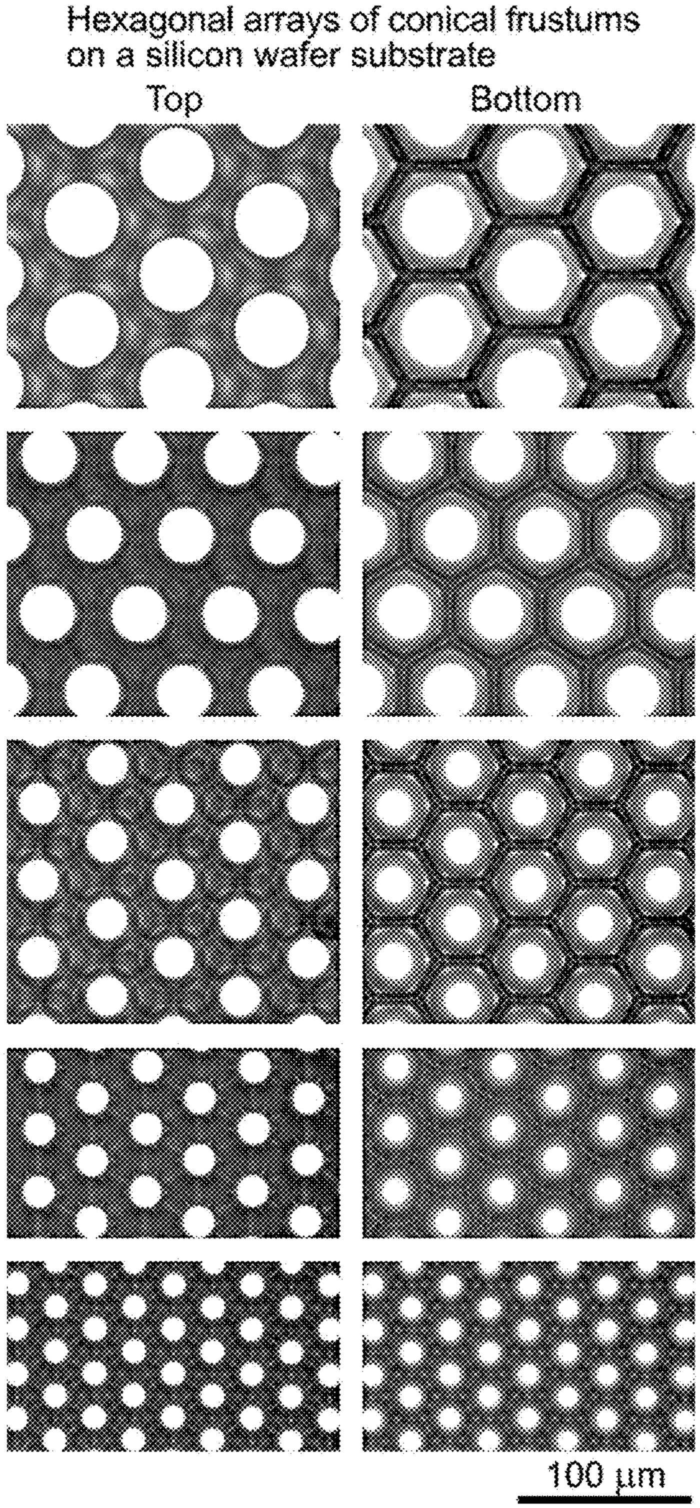
FIG. 14 is a collection of images of microstructures of cured negative photoresist forming different hexagonal arrays of merged conical frustums on a silicon wafer substrate.

FIG. 14 shows cured SU8 microstructures forming hexagonal arrays of conical frustums of different sizes that resulted from the exposure at a tilt angle of 30° through transparent regions on the photomask that were hexagonal arrays of circles with small distances between the centers of the circles. The circles in the arrays on the photomasks had the diameters (from top to bottom) of 56, 40, 28, 20, and 14 μm, and the distances between the centers of the circles were 88, 80, 68, 52, and 38 μm, respectively. Because of the small distances and the large tilt angle, the exposure of SU8 to the UV-light occurred over the entire footprint of the arrays of circles on the photomask, leading to the formation of monolith pieces of cured SU8 with the shapes of arrays of merged conical frustums, covering the entire areas under the arrays of circles on the photomasks. The images were taken at the top of the microstructures and at the bottoms of the arrays of the conical frustums, which were 30 μm or more above the surface of the wafer. The images taken at the bottoms of the arrays had regular hexagonal patterns of the lines of merging between individual conical frustums. The draft angles were estimated at ~ 18°, corresponding to ~36° opening angles for the cones.

Example 2. Molding Using Microstructures

Molding of PDMS parts using the wafers with the microstructures of cured SU8 on the surface described in Example 1 as the masters for the molding.

The PDMS parts were molded by pouring ~1 mm thick layers of liquid PDMS pre-polymer (polydimethylsiloxane, Sylgard 184 by Dow Corning, with the parts A and B mixed at a 10:1 ratio) on the surface of each the of the three wafers described in Example 1, degassing the pre-polymer in a vacuum jar, and curing the PDMS by baking for 90 min in a 85° C. convection oven. The molded PDMS parts were detached from the wafers and placed on the bottoms of 60 mm cell culture dishes, with the surfaces that used to be in contact with the masters facing the top, for imaging under an upright inspection video microscope (Olympus BH2 equipped with a B/W USB camera, Chameleon 2, and 10×/0.25 and 20×/0.4 objective lenses). The top surface had microwells and micro-channels, which were negative replicas of the SU8 frustums and ridges on the surfaces of the wafers, as described in Example 1 (cf. FIGS. 12-16).

Figure 15:
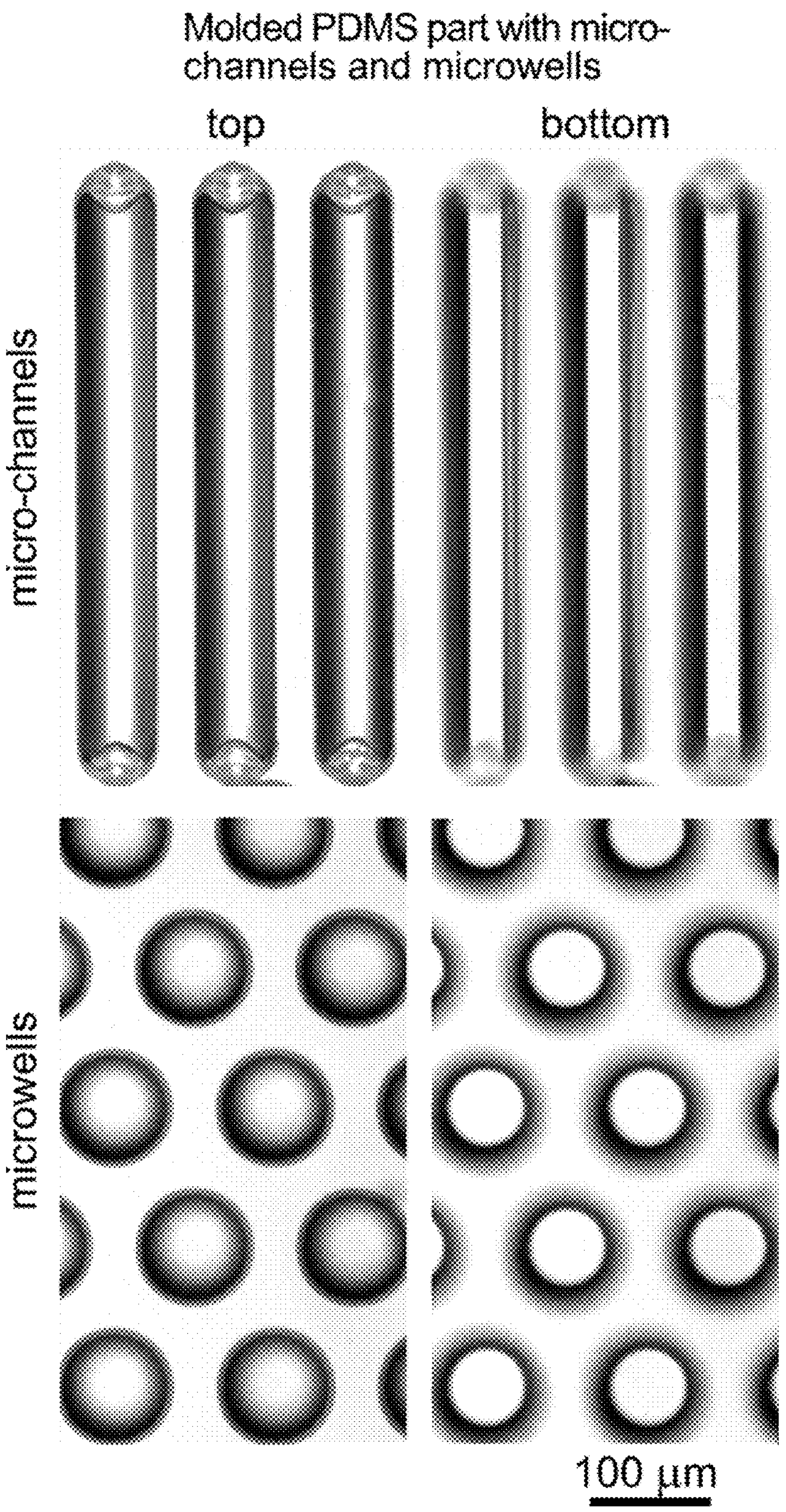
FIG. 15 is two micrographs of molded PDMS parts with micro-channels that have tapered profiles and with microwells that have shapes of conical frustums.

FIG. 15 shows two different segments of the PDMS part molded using (as the master) the wafer with the SU8 microstructures obtained from the UV-photolithography with the collimated light beam directed at the tilt angle of 30° and moved around the axis of rotation by 360°. The imaging was with the 10×/0.25 objective. The video microscope was focused either at the top of the PDMS part or at the bottom of the microwells or micro-channels. One of the segments had an array of parallel microchannels, which were ~85 μm deep, ~500 μm long, ~73 μm wide at the top, and ~30 μm wide at the bottom, with ~14° draft angles (~28° taper angle; cf. microstructures in FIG. 11). The pattern on the photomask used to make the part of the master that produced this segment was a parallel array of 20 μm wide and 500 μm long transparent strips with 80 μm wide opaque partitions. The other segment of the molded PDMS part had an array of ~85 μm deep conical frustum microwells, with ~99 μm diameter the top and ~65 μm diameter at the bottom and with ~28° opening angles (~14° draft angles). The corresponding pattern on the photomask was a hexagonal array of 56 μm diameter transparent circles with 136 μm center-to-center distances.

Figure 16:
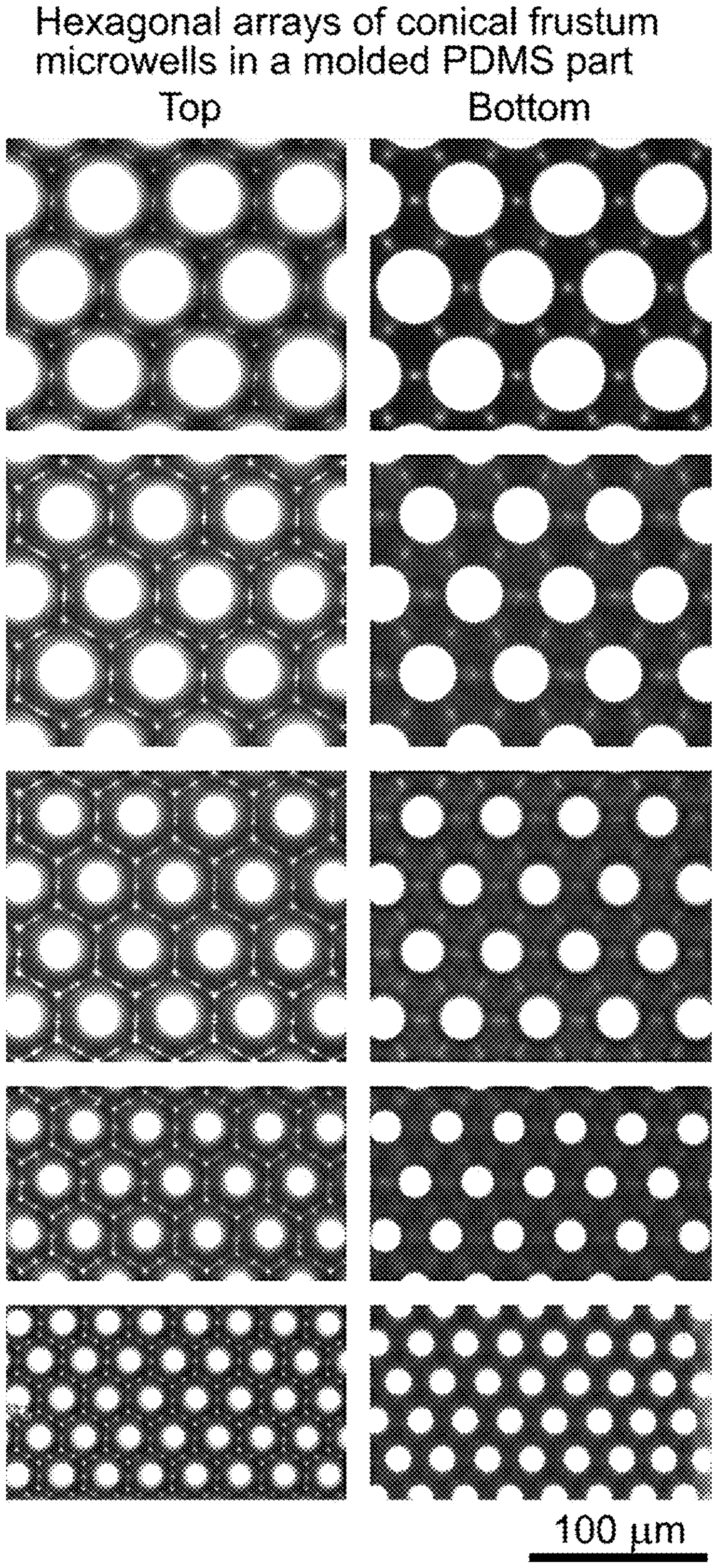
FIG. 16 is a set of images of hexagonal arrays of conical frustum microwells on the surface of a molded PDMS part taken under bright-field illumination.

FIG. 16 illustrates a set of images of hexagonal arrays of conical frustum microwells with various sizes in a molded PDMS part. The PDMS part was molded using (as the master) the wafer with the SU8 microstructures obtained from the UV-photolithography with the collimated light beam directed at the tilt angle of 30° and moved around the axis of rotation by 360°. The microwell arrays shown in the images were negative replicas of the arrays of conical frustum microstructures similar to those shown in FIG. 14. The conical microwells had bottoms with the diameters of (from top to bottom) ~65, 48, 36, 28, and 22 μm with the center-to center distances of ~88, 80, 68, 52, and 38 μm, respectively. The opening angles were ~36°. The images were taken with a 10×/0.25 objective under bright-field illumination. The microscope was focused either at the top of the array or the bottom of the microwells. The bottoms of the microwells were ~85 μm below the surface of the molded part. The tops of the arrays were ~30 μm or more below the molded part. The images taken at the top of the arrays show regular hexagonal patterns of lines of the merging between individual conical frustums.

Figure 17:
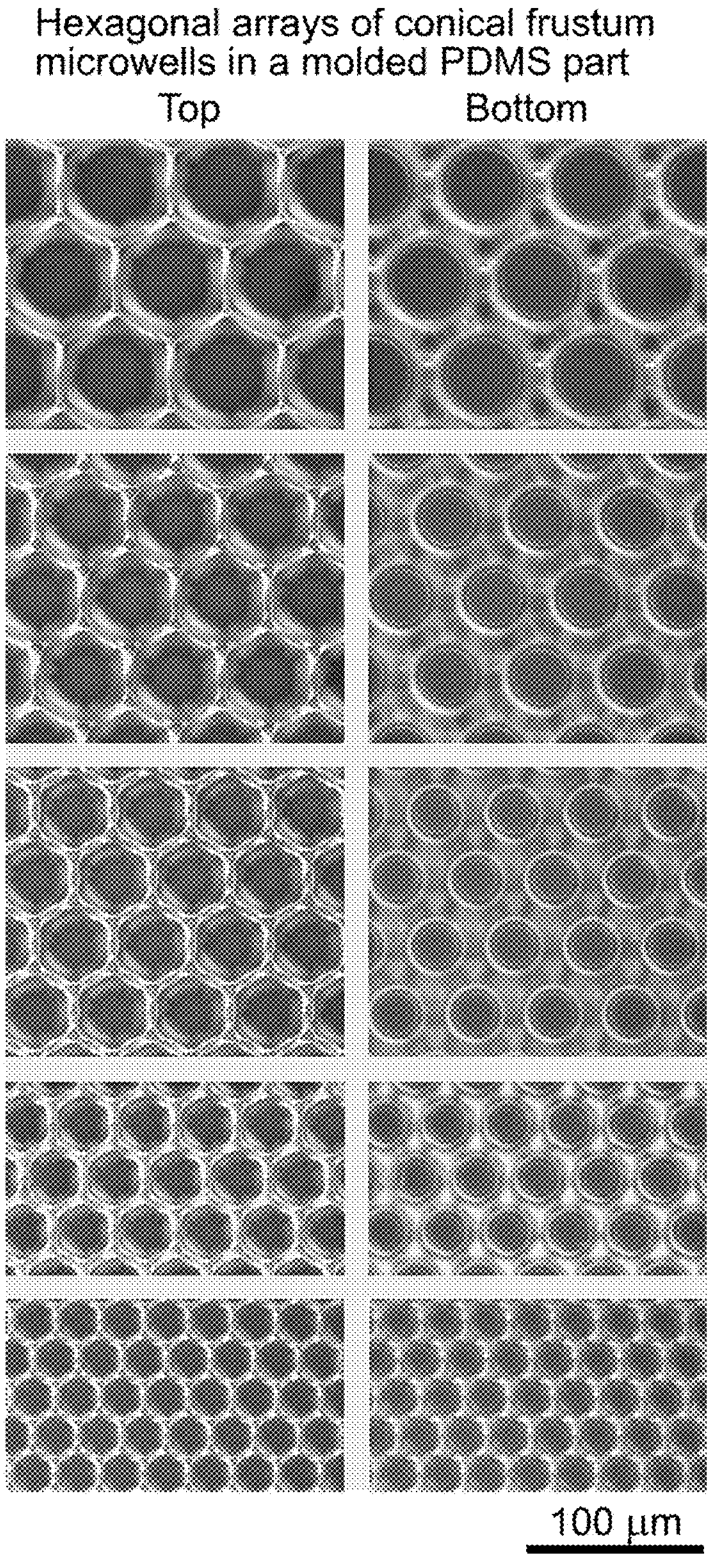
FIG. 17 is a set of images of hexagonal arrays of conical frustum microwells on the surface of a molded PDMS part taken under dark-field illumination.

FIG. 17 shows a set of images of arrays of conical frustum microwells with various sizes in a molded PDMS part. The images were taken with a 10×/0.25 objective under dark-field illumination. The regions shown in the images were similar to those shown in FIG. 16. The microwells had bottoms with the diameters of (from top to bottom) ~65, 48, 36, 28, and 22 μm with the center-to center distances of ~88, 80, 68, 52, and 38 μm, respectively. Under the dark-field illumination, sharp boundaries (e.g., the boundaries between individual conical frustum microwells) appear bright and are generally emphasized.

Figure 18:
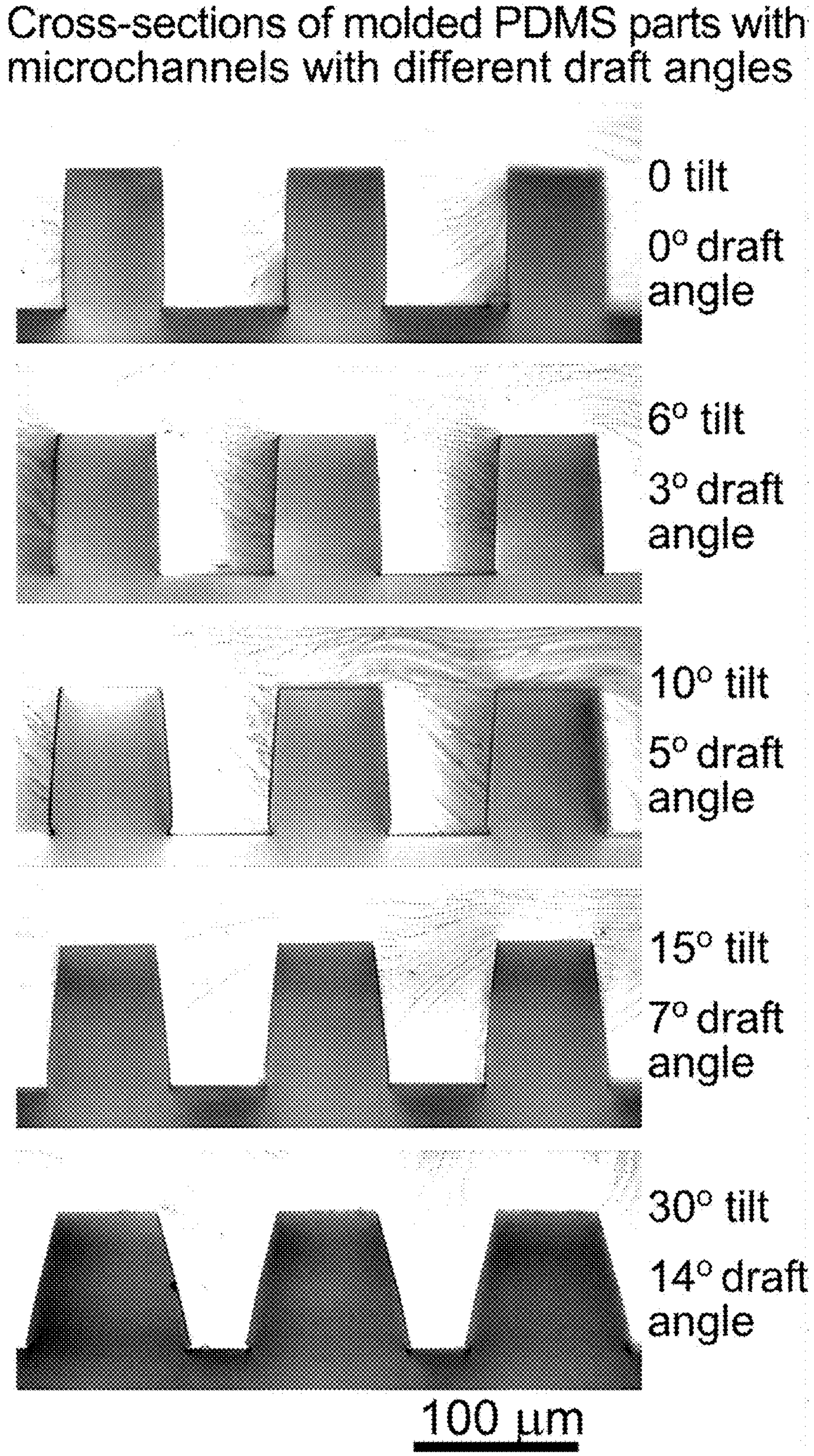
FIG. 18 is a set of images of cross-sections of micro-channels with different draft angles in molded PDMS parts.

FIG. 18 shows images of cross-sections of arrays of micro-channels in six molded PDMS parts made with the three silicon wafers (used as masters) discussed in Example 1 that had the microstructures of cured SU8 fabricated with different tilt angles. The pattern on the photomask that produced the arrays of the micro-channels was an array of 500 μm long and 56 μm wide transparent strips with 80 μm wide opaque partitions. The tilt angles were 0, 6, 10, 15, and 30° with a continuous (even angular velocity) rotation of the optical assembly by 360°. To photograph the cross-sections, each of the molded PDMS parts was cut with a scalpel along two long lines orthogonal to the micro-channels and two short lines parallel to the micro-channels. The cutout strips of PDMS were mounted on glass microscope slides (75×25×1 mm) with the planes of the cuts across the micro-channels facing the top and exposing the micro-channel cross-sections. The images of the cross-sections were taken with a 20×/0.40 objective under bright-field illumination. The brighter regions at the top of the images were PDMS parts; the darker regions at the bottom were voids. The draft angles were assessed by the image analysis and were found to be ~0, 3°, 5°, 7°, and 14°, respectively, for the tilt angles of 0, 6°, 10°, 15°, and 30°.

Example 3. Replica Production

A positive replica of a wafer with UV-lithography fabricated microstructures (described in Example 1) is made in epoxy, using (as a master) a molded PDMS part described in Example 2, and examined under a microscope.

The molded PDMS part described in Example 2 (cf. FIGS. 17-19) that was made using as the master the silicon wafer with the SU8 microstructures on the surface, which was fabricated using the UV-photolithography with the tilt angle of 30° (cf. FIGS. 13, 15, and 16), was used to make a monolith replica of the wafer with the microstructures. The epoxy replica was made in a UV-curable epoxy RapidFix UV Liquid Plastic Adhesive (Boss Products USA; purchased from Amazon.com). The surface of the molded PDMS part was passivated by vapor-phase treatment with Trimethylchlorosilane (TMCS, by Thermo Fisher Scientific). The molded PDMS part was placed on the bottom of a 60 mm Petri dish, with the side with the micro-channels and microwells facing the top, an ~1 mm thick layer of the epoxy was poured onto the surface of the part, and the dish was placed into a vacuum jar for degassing the epoxy. The epoxy was cured with 365 nm UV-light, and the cured epoxy part was detached from the molded PDMS part. The cured epoxy was flexible and relatively soft, rendering it a suboptimal material for making masters for molding. On the other hand, the cured epoxy was easy to cut with a scalpel blade that facilitated the imaging of microstructures on the surface of the epoxy part.

To that end, the epoxy part was mounted, with the side with the microstructures facing the top, and cut along two long parallel lines, with one of the lines being very close to boundaries of three arrays of conical frustums on the surface of the part, and also along two short orthogonal lines to cut out a long narrow strip. The cutout strip was mounted onto a glass slide (75×25×1 mm), with the plane of the cut made near the boundary of the conical frustum arrays facing the top. The side with the arrays of conical frustums was oriented orthogonally to the surface of the glass slide. The glass slide was tilted by ~22° to partly expose the side with the conical frustums (which became oriented at ~68° towards the horizontal plane) to imaging with an upright microscope. The imaging was performed with an upright inspection video microscope (Olympus BH2 equipped with a B/W USB camera, Chameleon 2) using 10×/0.25 and 5×/0.1 objectives under both bright-field and dark-field illumination. The image contrast was enhanced by digital processing.

Figure 19:
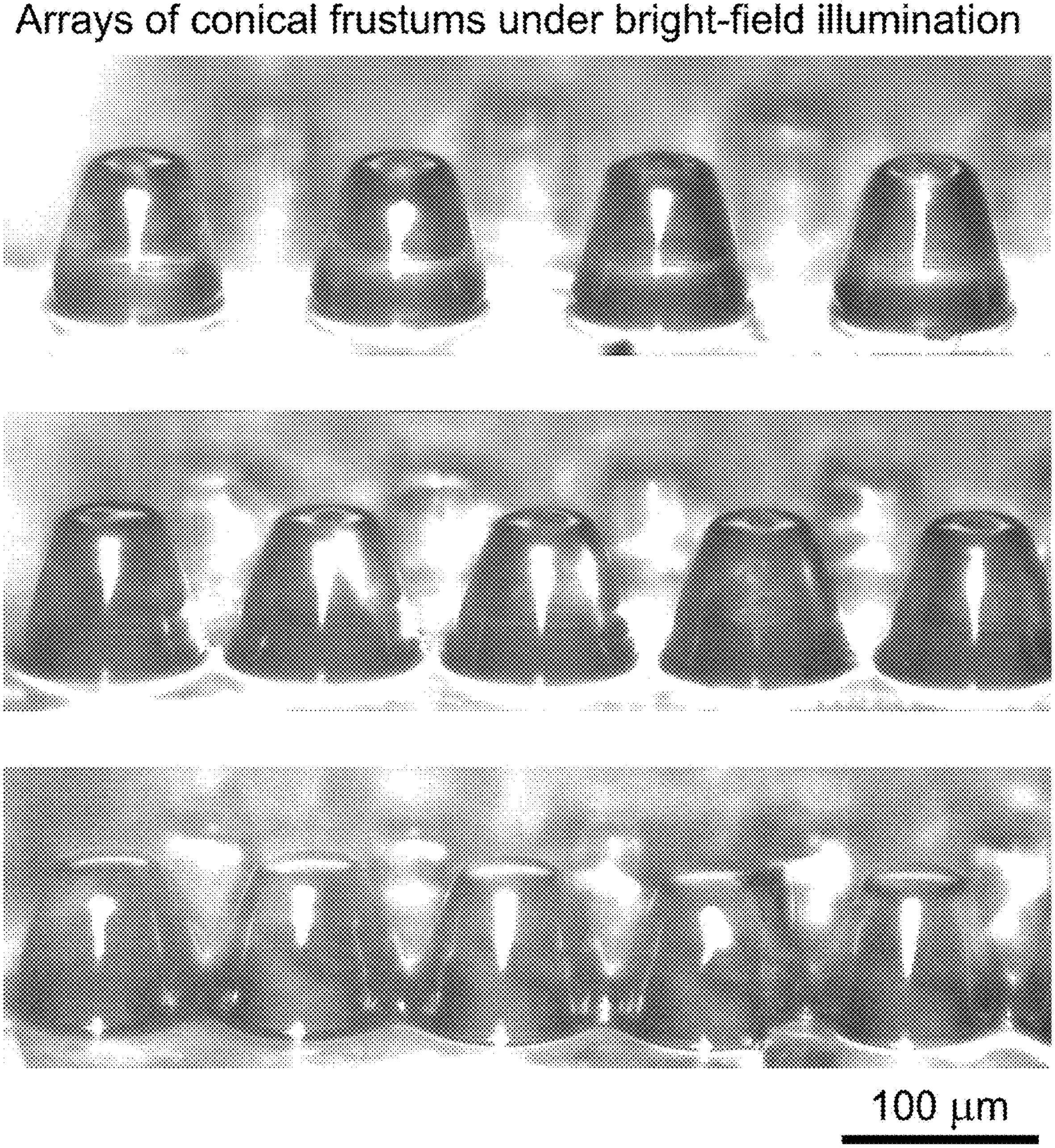
FIG. 19 is a set of images of hexagonal arrays of conical frustums in an epoxy replica taken under bright-field illumination.

In FIG. 19, a set of bright-field images of hexagonal arrays of conical frustums with various distances between the centers of the frustums on the surface of the epoxy part is shown. The imaging was done with the 10×/0.25 objective. The diameters of flat areas on the top sides of the frustums were ~50 μm, and the distances between the centers of adjacent frustums were ~132, 110, and 102 μm. At the smallest center-to-center distance, adjacent frustums merged.

Figure 20:
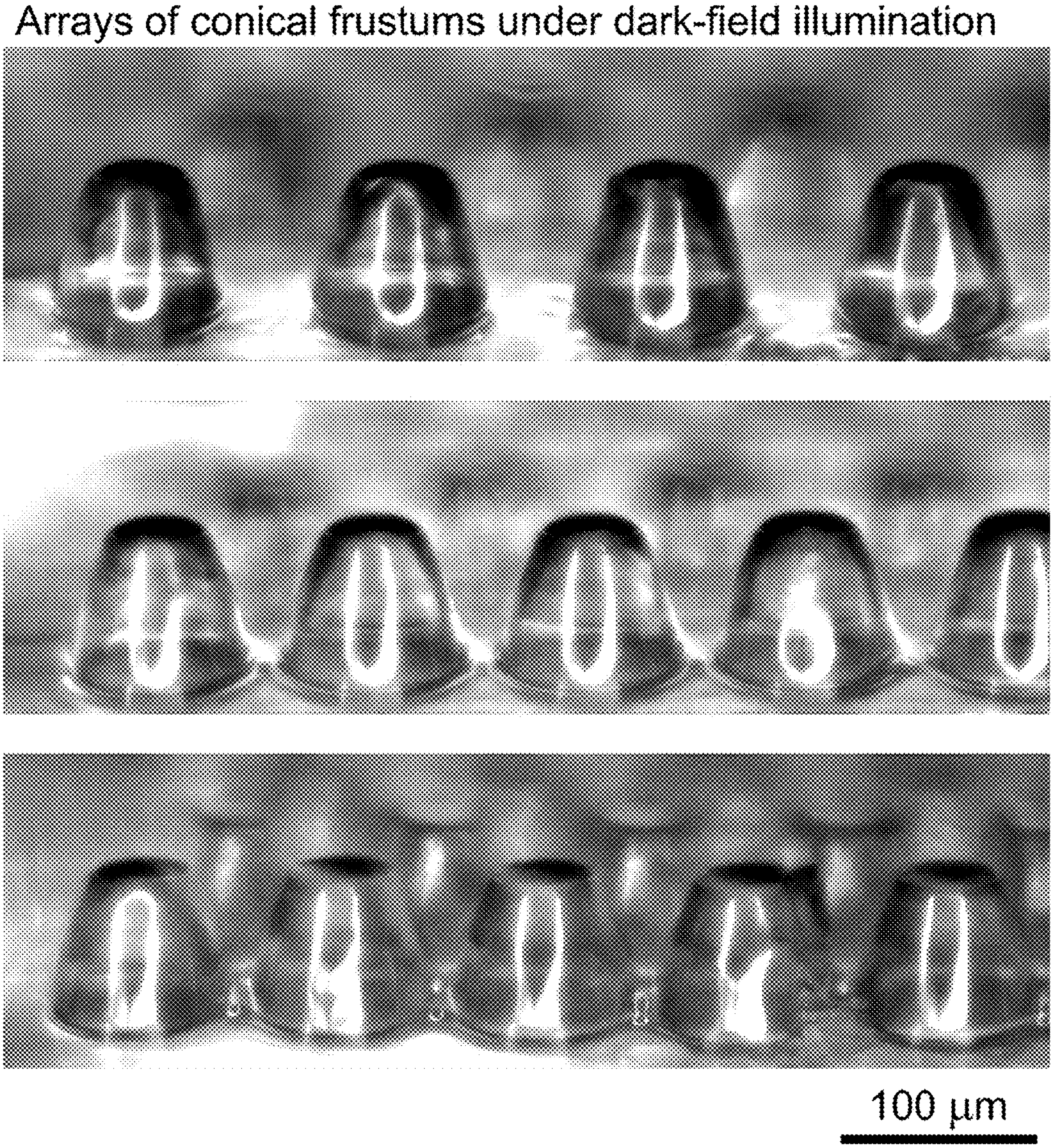
FIG. 20 is a set of images of arrays of conical frustums in an epoxy replica taken under dark-field illumination.

FIG. 20 shows a set of dark-field images of hexagonal arrays of conical frustums with various distances between the centers of the frustums on the surface of the epoxy part (cf. FIG. 19) is shown. The imaging was done with the 10×/0.25 objective. The diameters of flat areas on the top sides of the frustums were ~50 μm, and the distances between the centers of adjacent frustums were ~132, 110, and 102 μm. At the smallest center-to-center distance, adjacent frustums merged.

Figure 21:
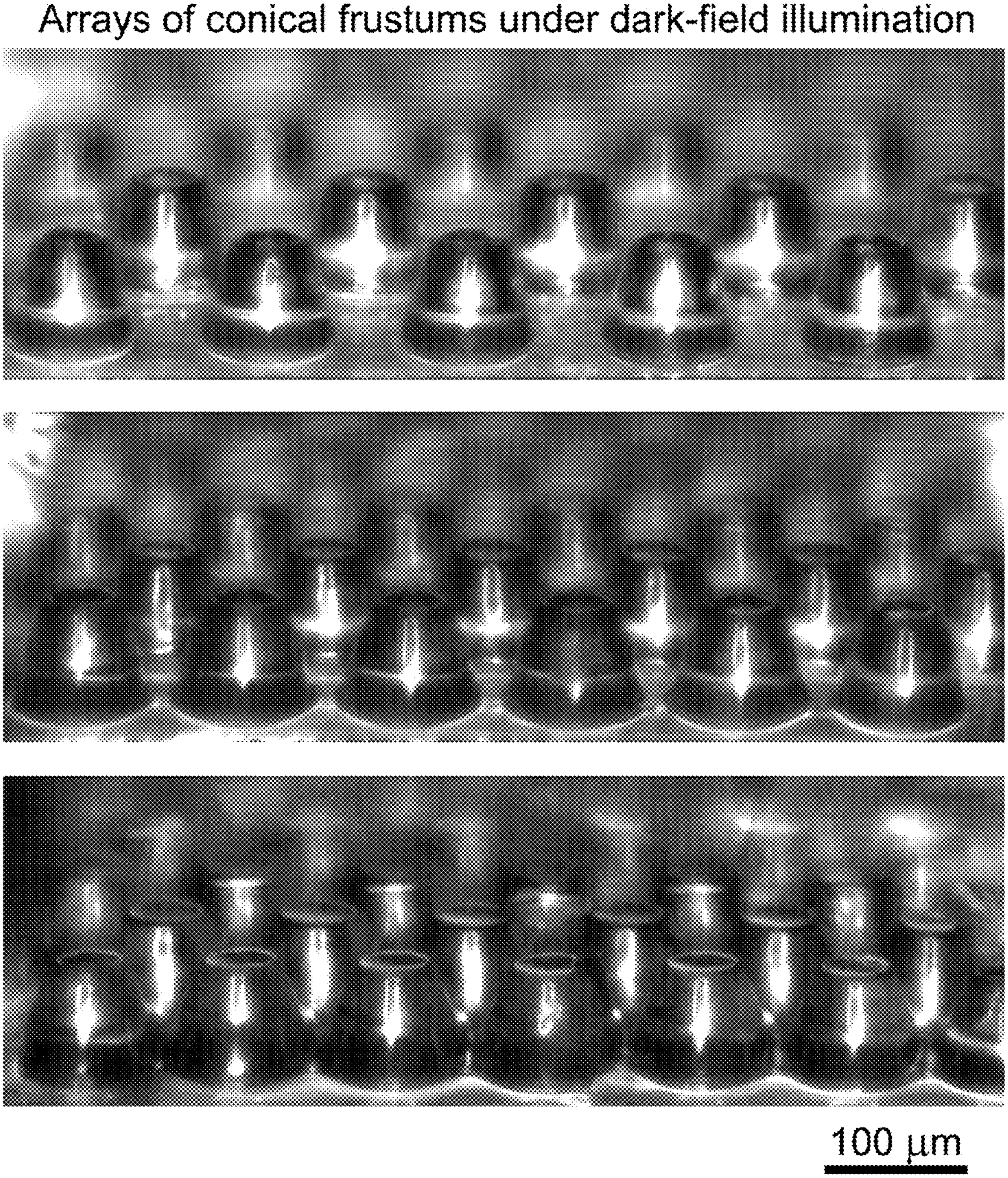
FIG. 21 is another set of images of arrays of conical frustums in an epoxy replica taken under dark-field illumination.

In FIG. 21, a set of dark-field images of hexagonal arrays of conical frustums with various distances between the centers of the frustums on the surface of the epoxy part (cf. FIGS. 19-20) is shown. The imaging was done with the 5×/0.1 objective.

Figure 22:
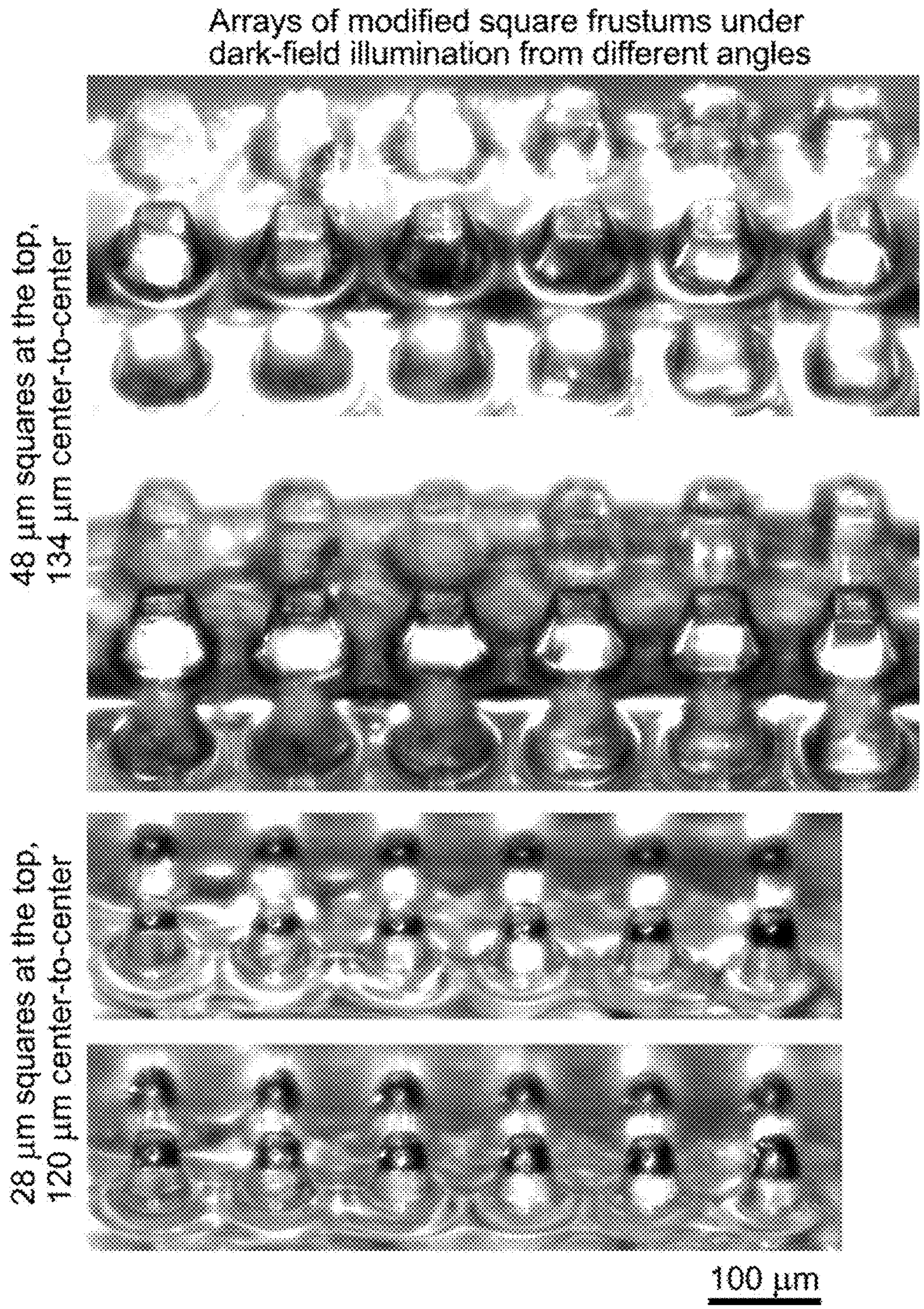
FIG. 22 is a set of images of arrays of modified square frustums in an epoxy replica taken under dark-field illumination.

FIG. 22 shows a set of dark-field images of square arrays of modified square frustums on the surface of the epoxy part. The flat squares at the top of the frustums were 48 and 28 μm in size, with distances between the frustum centers of 134 and 120 μm, respectively. The images were taken with the 5×/0.1 objective with the epoxy part tilted at different angles with respect to the horizontal. The cross-sections of the frustums in the plane of the epoxy part were near square (with somewhat rounded corners) at the top and became increasingly rounded towards the bottom. The cross-sections near the bottom were rounded octagonal for the larger (48 μm) frustums and near circular for the smaller (28 μm) frustums. The shapes of these modified square frustums reflected the shapes of the portions of the 85 μm thick layer of the SU8 photoresist that received sufficient UV-exposure through the 40 and 20 μm square transparent regions of the photomask during the UV-photolithography with the 30° tilt angle and with 360° rotation of the optical arrangement.

Although the present invention has been described in considerable detail with reference to certain preferred embodiments and the examples provided herein, other embodiments are possible, and many modifications and changes may be implemented by those of skill in the art. Accordingly, the scope of the appended claims should not be limited by the foregoing disclosure and description of preferred embodiments but should be construed to include obvious variations.

What is claimed is:

1. A system for photolithographic fabrication of microstructures, the system comprising:

a substrate mount configured to support a substrate;

an optical assembly comprising:

an LED light source having a luminous area configured to emit ultraviolet (UV) light along an optical path, the luminous area having an area diameter; and a light collimator disposed within the optical path and configured to receive light from the LED light source and generate a collimated light beam having a beam diameter with a spatially uniform light intensity of UV-light across the collimated light beam, wherein more than one-third of a power of the UV-light in the collimated light beam emanates from the luminous area, and wherein the area diameter is less than one-third of the beam diameter, wherein the optical assembly is configured to deliver a collimated light beam along the optical path to an illumination area proximate to the substrate mount;

a photomask aligner disposed on the substrate mount, the photomask aligner configured to retain a patterned photomask within the optical path for projection of a pattern onto the substrate, the pattern corresponding to at least a portion of the microstructures; and a multi-axis support assembly comprising a rotating support having an axis of rotation and an adjustable angle mount, the support assembly configured for varying one or more of a direction and an angle of the collimated beam relative to the substrate on the substrate mount.

2. The system of claim 1, wherein the optical assembly is disposed at a fixed position relative to a base and the substrate mount is disposed on the adjustable angle mount configured to tilt the substrate mount relative to the base so that the collimated light impinges on the photomask and the substrate at a predetermined angle.

3. The system of claim 1, wherein the optical assembly is disposed at a fixed position relative to a base and the substrate mount is disposed on the rotating support affixed to the base and configured to rotate the substrate mount relative to the optical assembly.

4. The system of claim 1, wherein the substrate mount is disposed on a base and the optical assembly is disposed on the adjustable angle mount configured to move relative to the base so that the collimated light impinges on the photomask and the substrate at a predetermined angle.

5. The system of claim 1, wherein the substrate mount is disposed on the rotating support affixed to the base and the optical assembly is disposed on the adjustable angle mount configured to tilt relative to the base so that the collimated light impinges on the photomask and the substrate at a predetermined angle.

6. The system of claim 1, wherein the light collimator comprises a proximal lens having a first diameter and a distal lens having a second diameter, wherein the proximal lens is disposed at first distance from the light source and the distal lens is disposed at a second distance from the light source so that the collimated light beam diverges by less than 0.01 radian (full width at half height) over a cross-section of an approximately 12.5 cm diameter circle.

7. The system of claim 6, wherein an effective ratio of the area diameter and the second distance is on the order of 0.008.

8. The system of claim 6, wherein the second diameter is within a range of 70 mm to 200 mm.

9. The system of claim 6, wherein the first diameter is approximately 75 mm.

10. The system of claim 6, wherein the proximal lens and the distal lens are each selected from a plano-convex lens, a meniscus lens, a double convex lens, and a Fresnel lens.

11. The system of claim 6, wherein one or both of the proximal lens and the distal lens is coated with an anti-reflection coating.

12. The system of claim 1, wherein the photomask aligner is configured to translate the photomask in at least an X-Y plane relative to the substrate mount.

13. The system of claim 1, wherein the beam diameter is within a range of 60 mm to 125 mm, wherein the spatially uniform light intensity varies by less than 10% peak-to-peak, and wherein the collimated light beam diverges by less than 0.03 rad (full width at half-height).

14. A method for fabrication of microstructures on a substrate, the method comprising:

applying a UV-light-sensitive coating to a surface of the substrate;

using the system of claim 1, disposing the coated substrate on the substrate mount;

aligning the photomask with the substrate;

controlling the support assembly to modify an incident angle of the collimated light beam impinging on the patterned photomask;

exposing the coated substrate to portions of the collimated light beam transmitted through the patterned photomask for one or more exposures to define the microstructures within the UV-light-sensitive coating; and removing unexposed UV-light-sensitive coating from the substrate to leave defined microstructures on the substrate.

15. The method of claim 14, wherein the steps of controlling the support assembly and exposing the coated substrate comprise:

adjusting a tilt angle of the substrate mount relative to the optical assembly to cause the collimated light beam to impinge on the coated substrate at an angle corresponding to a draft angle within one or more target microstructure;

exposing the coated substrate for a first exposure;

rotating the substrate mount by a first rotational increment;

exposing the coated substrate for a second exposure;

rotating the substrate mount by a second rotational increment; and repeating the steps of exposing an rotating for a plurality of subsequent increments until the one or more target microstructure has been fully exposed.

16. The method of claim 14, wherein the steps of controlling the support assembly and exposing the coated substrate comprise:

adjusting a tilt angle of the substrate mount relative to the optical assembly to cause the collimated light beam to impinge on the coated substrate at an angle corresponding to a draft angle within one or more target microstructure;

exposing the coated substrate for a first exposure;

rotating the optical assembly by a first rotational increment;

exposing the coated substrate for a second exposure;

rotating the optical assembly by a second rotational increment; and repeating the steps of exposing an rotating for a plurality of subsequent increments until the one or more target microstructure has been fully exposed.

17. The method of claim 14, wherein the steps of controlling the support assembly and exposing the coated substrate comprise:

adjusting a tilt angle of the optical assembly relative to the substrate mount to cause the collimated light beam to impinge on the coated substrate at an angle corresponding to a draft angle within one or more target microstructure;

exposing the coated substrate for a first exposure;

rotating the substrate mount by a first rotational increment;

exposing the coated substrate for a second exposure;

rotating the substrate mount by a second rotational increment; and repeating the steps of exposing and rotating for a plurality of subsequent increments until the one or more target microstructure has been fully exposed.

18. The method of claim 14, wherein the steps of controlling the support assembly and exposing the coated substrate comprise:

adjusting a tilt angle of the optical assembly relative to the substrate mount to cause the collimated light beam to impinge on the coated substrate at an angle corresponding to a draft angle within one or more target microstructure;

exposing the coated substrate for a first exposure;

rotating the optical assembly by a first rotational increment;

exposing the coated substrate for a second exposure;

rotating the optical assembly by a second rotational increment; and repeating the steps of exposing and rotating for a plurality of subsequent increments until the one or more target microstructures has been fully exposed.

19. The method of claim 15, wherein rotating is performed at a continuous angular velocity configured to expose the UV-light-sensitive coating for a sufficient period of time for curing.

20. The method of claim 15, wherein the draft angle is a positive angle, orthogonal, or a negative angle relative to the substrate.

21. The method of claim 14, wherein the microstructures comprise multiple structures having different depths and draft angles, and wherein the steps of controlling the support assembly, exposing the coated substrate, and removing unexposed are repeated using one or more additional photomask.

22. The method of claim 21, further comprising applying an additional UV-light-sensitive coating to the surface of the substrate prior to repeating the steps of controlling and exposing.

23. The method of claim 21, wherein the incident angle of the collimated light is changed from an initial incident angle prior to repeating the steps of controlling and exposing.

24. The method of claim 14, wherein the substrate is further coated with an anti-reflection coating.

25. The method of claim 14, wherein a space between the photomask and a surface of the UV-light-sensitive coating is filled with a liquid medium configured to reduce divergence of the collimated light beam.

26. The method of claim 14, wherein the substrate is a wafer or a cover glass.

27. The method of claim 14, wherein the UV-light-sensitive coating is a UV-curable epoxy, a UV-curable photoresist, or a negative photoresist.

28. The method of claim 14, further comprising postprocessing the substrate with the defined microstructures to form a master mold, wherein a moldable material is applied to the master mold and cured to define molded microstructures comprising microwells or micro-channels.

29. The method of claim 28, wherein the moldable material is a silicone elastomer.

30. The method of claim 29, further comprising using the molded microstructures formed in the molded material as a secondary mold for fabricating replica microstructures in a monolithic material.

* * * * *